United States Patent
Kim et al.

(10) Patent No.: US 9,768,359 B2
(45) Date of Patent: Sep. 19, 2017

(54) SEMICONDUCTOR DEVICE, METHOD FOR MANUFACTURING SAME, LIGHT-EMITTING DIODE, AND METHOD FOR MANUFACTURING SAME

(71) Applicant: INTELLECTUAL DISCOVERY CO., LTD., Seoul (KR)

(72) Inventors: Tae Geun Kim, Seongnam-si (KR); Kyung Heon Kim, Seoul (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 0 days.

(21) Appl. No.: 15/126,352

(22) PCT Filed: Jan. 15, 2015

(86) PCT No.: PCT/KR2015/000433
§ 371 (c)(1),
(2) Date: Sep. 15, 2016

(87) PCT Pub. No.: WO2015/147430
PCT Pub. Date: Oct. 1, 2015

(65) Prior Publication Data
US 2017/0084793 A1    Mar. 23, 2017

(30) Foreign Application Priority Data

Mar. 28, 2014  (KR) .................. 10-2014-0036767
Mar. 28, 2014  (KR) .................. 10-2014-0036768

(51) Int. Cl.
*H01L 33/00*     (2010.01)
*H01L 33/44*     (2010.01)
(Continued)

(52) U.S. Cl.
CPC .......... *H01L 33/44* (2013.01); *H01L 33/0075* (2013.01); *H01L 33/32* (2013.01);
(Continued)

(58) Field of Classification Search
None
See application file for complete search history.

(56) References Cited

U.S. PATENT DOCUMENTS

| | | | |
|---|---|---|---|
| 8,558,254 B1 | 10/2013 | Ho et al. | |
| 2013/0264546 A1 | 10/2013 | Yu et al. | |
| 2015/0214501 A1* | 7/2015 | Kim | H01L 51/5212 257/40 |

FOREIGN PATENT DOCUMENTS

| | | |
|---|---|---|
| JP | 10-107320 A | 4/1998 |
| JP | 10-186011 A | 7/1998 |

(Continued)

OTHER PUBLICATIONS

International Search Report of PCT/KR2015/000433 dated Mar. 31, 2015 [PCT/ISA/210].

*Primary Examiner* — Minh-Loan Tran
(74) *Attorney, Agent, or Firm* — Sughrue Mion, PLLC

(57) ABSTRACT

A semiconductor device is disclosed, and the semiconductor device comprises: a semiconductor layer; and a transparent electrode which is formed from a resistance switching material and is formed on one side of the semiconductor layer, wherein the transparent electrode includes a channel on which an electron is capable of hopping and a conductive path formed by applying a voltage that is a threshold voltage or more, and the threshold voltage for forming the conductive path is lowered by the channel.

20 Claims, 15 Drawing Sheets

(51) Int. Cl.
  *H01L 33/62* (2010.01)
  *H01L 33/36* (2010.01)
  *H01L 33/42* (2010.01)
  *H01L 33/40* (2010.01)
  *H01L 33/32* (2010.01)

(52) U.S. Cl.
  CPC .............. *H01L 33/36* (2013.01); *H01L 33/40* (2013.01); *H01L 33/42* (2013.01); *H01L 33/62* (2013.01); *H01L 2933/0016* (2013.01); *H01L 2933/0025* (2013.01)

(56) References Cited

FOREIGN PATENT DOCUMENTS

KR  10-2013-0113149 A  10/2013
KR  10-2014-0037516 A  3/2014

\* cited by examiner (a)

(b)

(a)

(b)

(a)

(b)

(a)

(b)

(c)

(a)

(b)

(c)

(a)

(b)

(a)

(b)

(a)

(b)

SEMICONDUCTOR DEVICE, METHOD FOR MANUFACTURING SAME, LIGHT-EMITTING DIODE, AND METHOD FOR MANUFACTURING SAME

CROSS REFERENCE TO RELATED APPLICATIONS

This application is a National Stage of International Application No. PCT/KR2015/000433, filed Jan. 15, 2015, claiming priorities based on Korean Patent Application Nos. 10-2014-0036767 and 10-2014-0036768, both filed Mar. 28, 2014, the contents of all of which are incorporated herein by reference in their entirety.

BACKGROUND OF THE INVENTION

Field of the Invention

The subject application relates to a semiconductor device, a method for manufacturing a semiconductor device, a light-emitting device, and a method for manufacturing the light-emitting device.

Related Art

A transparent electrode is used in various fields, such as a Light-Emitting Diode (LED), a solar cell, a UV sterilizer for medical care, and fisheries, and application fields and the demand for the transparent electrode tend to gradually increase. In particular, the transparent electrode is chiefly used in the LED field. A current transparent electrode technology applied to an LED chiefly consists of an Indium Tin Oxide (ITO)-based technology which may be applied to a visible ray region (400 nm-800 nm) and some region (365 nm~400 nm) of the entire UV region (10 nm-400 nm).

Recently, the demand for an UV LED that generates light of an UV region suddenly increases, but it is difficult to commercialize the UV LED because a transparent electrode having high conductivity and high transmittance in the UV region has not been developed so far.

For example, in the case of an UV LED having an ITO transparent electrode formed therein, which has been most used now, light of an UV region (10 nm~320 nm) of a short wavelength generated from an active layer is mainly absorbed by ITO, and thus light externally extracted after passing through ITO is only about 1%.

FIG. 1 is a diagram showing transmittance in an LED structure according to a conventional technology.

This figure shows transmittance if a conventional ITO transparent electrode has been formed in a P-GaN semiconductor layer.

From FIG. 1, it may be seen that transmittance is 80% more in a region in which a wavelength is 350 nm or more, but transmittance rapidly decreases in an UV region of a short wavelength. In particular, transmittance decreases to 20% or less in a short wavelength region of 116 nm or less.

In another conventional technology for solving such a problem, a transparent electrode is not formed on a semiconductor layer, such as p-AlGaN, but a metal electrode pad is directly formed on the semiconductor layer. However, there is a problem in that an ohmic contact is not performed because a difference between the work functions of metal and the semiconductor layer is too great. Furthermore, there is a problem in that the amount of light generated from an active layer is significantly reduced because an electric current is concentrated on a metal electrode pad and is not supplied to the entire active layer.

In order to solve such problems, various researches are being carried out, but a transparent electrode having both high conductivity and high transmittance in an UV region has not been developed. The reason for this is that the conductivity and transmittance of a substance have a tradeoff relation. A substance having transmittance high enough to be used in the UV region has very low conductivity to be used as an electrode because it has a large bandgap, and thus cannot be used as an electrode because an ohmic contact with a semiconductor substance is not performed.

As an example of a technology suggested to solve such a problem, an application for a technology for forming a transparent electrode using a silver (Ag) thin film was filed as Korean Patent Application No. 10-2007-0097545. In such a conventional technology, however, if a transparent electrode is formed using silver (Ag), it is very difficult to thinly deposit silver (Ag) on a semiconductor layer so that an ohmic contact is performed. Although silver (Ag) is thinly deposited on the semiconductor layer, as shown in the graph of FIG. 4 of Korean Patent Application No. 10-2007-0097545, transmittance sharply decreases to 80% or less in a region in which a wavelength of light is 420 nm or less and transmittance decreases to 50% or less in a region in which a wavelength of light is 380 nm or less. There is no difference compared to transmittance of a conventional ITO electrode, which makes it difficult to expect the improvement of transmittance of an UV region.

Meanwhile, a light-emitting device, such as a Light-Emitting Diode (LED), had been used only in a limited field, such as light sources for display in home appliances in the early 1990s. Red, green, and blue LEDs capable of implementing high brightness and white light were developed based on the development of a new process technology and started to be used in the entire lift from the 2000s. The development of such an LED has an excellent environment-friendly property because the LED does not include an environment-harmful substance, such as mercury (Hg) used in existing lighting devices such as an incandescent lamp or a fluorescent lamp. It is expected that the LED will replace the existing light sources based on advantages, such as long lifespan and low power consumption characteristics.

An LED may be basically divided into a common type (or lateral type) light-emitting device and a vertical type (or thin GaN) light-emitting device in terms of its form. Furthermore, there is a flip-chip type light-emitting device, that is, a middle form of the common type and the vertical type.

The structure of the common type LED has a basic form including a single active layer that emits light and two cladding layers that surrounds the active layer on both sides thereof. The cladding layer coming into contact with an electrode may be subject to n-doping or p-doping. In general, one cladding layer portion coming into contact with a substrate is subject to n-doping and the other cladding layer portion is subject to p-doping. When a voltage is applied through an electrode according to the polarity of the doped cladding layer, the n-doped cladding layer supplies electrodes and the p-doped cladding layer supplies holes, thereby making an electric current flow. Accordingly, the electrons and holes are combined in the active layer, thus emitting light. In this case, the substrate is not separated, but remains intact. That is, in general, the common type LED has a structure in which an n type semiconductor, a quantum well, and a p type semiconductor are stacked on a substrate, etching is performed so that part of the n type semiconductor is exposed, a p type electrode is formed on the p type semiconductor, and an n type electrode is formed in the exposed n type semiconductor device.

The flip-chip type LED has a form in which the common type LED is turned over and fixed on a sub-mount through a stud bump, and is the same as the common type LED in terms of a basic structure for emission. In the flip-chip type LED having a relatively excellent heat-dissipation characteristic and high output characteristic compared to the common type LED, in general, light is emitted through the substrate.

The vertical type LED (VLED) also has the same basic structure for emission as the common type LED. In this case, an electrode is formed by separating a substrate itself from an n type semiconductor in order to expose the n type semiconductor without etching, instead of forming the electrode by exposing part of the n type semiconductor by etching. That is, a bonding/reflector and a receptor substrate are sequentially attached to a p type semiconductor device of an upper portion in the basic structure of the stacked common type LED, and the electrode is then formed. After the substrate of a lower portion is detached from the n type semiconductor device, the device is turned over and the electrode is then formed, thereby completing the basic structure of the vertical type LED. In other words, the vertical type LED has a form obtained by detaching the substrate in the common type LED structure and then turning over the device. Light emitted from the active layer is reflected vertically from a reflection plate at the bottom and then emitted toward an upper portion. The greatest advantage of the vertical type LED is a high heat-dissipation characteristic. Furthermore, the vertical type LED is advantageous in that emission efficiency is high compared to the common type LED because it has a vertical type structure of a thin GaN form from which the substrate has been removed.

As described above, the vertical type LED (VLED) attracts great interest due to advantages, such as an efficient heat dissipation plate and optical power improvements. However, in the present, it is essential to improve light extraction efficiency so as to fabricate a high-efficiency vertical type LED for the applications of a solid lighting device. The reason for this is that research of an electrode for improving light extraction efficiency is limited because the n electrode of the vertical type LED may have a problem, such as thermal damage, in a high temperature process. Furthermore, an LED manufacturing cost rises because additional processes, such as a Laser Lift Off (LLO) process for removing the substrate from the LED device and a reflection film deposition process, are required. Meanwhile, a polar problem, such as N face n-GaN, may be generated. Such a problem reduces the price competitiveness of an LED, and also deteriorates light extraction efficiency of the vertical type LED. Accordingly, there is a need for a technical solution for improving light efficiency of an LED by solving such problems.

SUMMARY OF THE INVENTION

The subject application has been made to solve the aforementioned problems of the conventional technologies, and an object of the subject application is to provide a semiconductor device including a transparent electrode having high transmittance with respect to an UV region and also having an excellent ohmic contact characteristic with respect to a semiconductor layer and a method for manufacturing the same.

Furthermore, the subject application has been made to solve the aforementioned problems of the conventional technologies, and an object of the subject application is to provide a light-emitting device that does not require an additional process for removing a growth substrate from an LED device in light-emitting devices, such as the common type, the flip-chip type, and the vertical type, and a method for manufacturing the same.

As technical means for accomplishing the technical objects, a semiconductor device according to a first aspect of the subject application includes a semiconductor layer and a transparent electrode made of a resistance change substance and formed on one side of the semiconductor layer, wherein the transparent electrode includes a channel on which electrons are capable of hopping and conductive paths formed by applying a voltage of a threshold voltage or more, and the threshold voltage forming the conductive paths may be lowered by the channel.

Furthermore, the light-emitting device according to a second aspect of the subject application may include the semiconductor device according to the first aspect of the subject application.

Furthermore, a method for manufacturing a semiconductor device according to a third aspect of the subject application includes the steps of providing a semiconductor layer; forming a transparent electrode made of a resistance change substance on one side of the semiconductor layer; forming a channel on which electrons are capable of hopping in the transparent electrode; and forming conductive paths by applying a voltage of a threshold voltage or more to the transparent electrode in which the channel has been formed, wherein the channel may lower the threshold voltage forming the conductive paths.

Furthermore, a light-emitting device according to a fourth aspect of the subject application includes a growth substrate; a light-emitting unit formed on one side of the growth substrate and an electrode pad formed on the other side of the growth substrate, wherein the growth substrate may include conductive paths formed by applying a voltage of a threshold voltage or more so that the electrode pad and the light-emitting unit are electrically connected.

Furthermore, a method for manufacturing a light-emitting device according to a fifth aspect of the subject application may include the steps of providing a growth substrate; forming a light-emitting unit on one side of the growth substrate; forming conductive paths by applying a voltage of a threshold voltage or more to the growth substrate; and forming an electrode pad on the other side of the growth substrate.

In accordance with the aforementioned technical means of the subject application, the transparent electrode is formed using a substance of a transparent material changing from a high resistance state to a low resistance state by an electric field applied thereto, and the resistance state of the transparent electrode is changed to the low resistance state by applying a voltage to the transparent electrode so that the transparent electrode has conductivity. Accordingly, the transparent electrode having an excellent ohmic characteristic with respect to the semiconductor layer formed on the other side of the transparent electrode and having high transmittance with respect to light of an UV region of a short wavelength in addition to a visible ray region and the semiconductor device including the transparent electrode can be formed.

Furthermore, in accordance with the technical means of the subject application, the channel on which electrons can hop is formed in the transparent electrode before a voltage is applied to the transparent electrode. Accordingly, a voltage applied to form the conductivity path in the transparent electrode can be lowered, and the uniformity of the conductivity path can be improved. Accordingly, the transparent electrode having improved reliability and conductivity and the semiconductor device including the same can be implemented.

Furthermore, light-emitting devices of various forms can be fabricated using such a transparent electrode.

Furthermore, in accordance with the technical means according to the fourth and fifth aspects of the subject application, the light-emitting device in which the growth substrate electrically connects the electrode pad and the light-emitting unit can be implemented because the conductivity path is formed in the growth substrate so that the growth substrate has conductivity. Accordingly, a problem occurring due to an etch process and an LLO process performed to remove the growth substrate, a polar problem, and the generation of a current crowing phenomenon can be prevented, and the thermal stability of the light-emitting device can be implemented.

DESCRIPTION OF EXEMPLARY EMBODIMENTS

Figure 1:
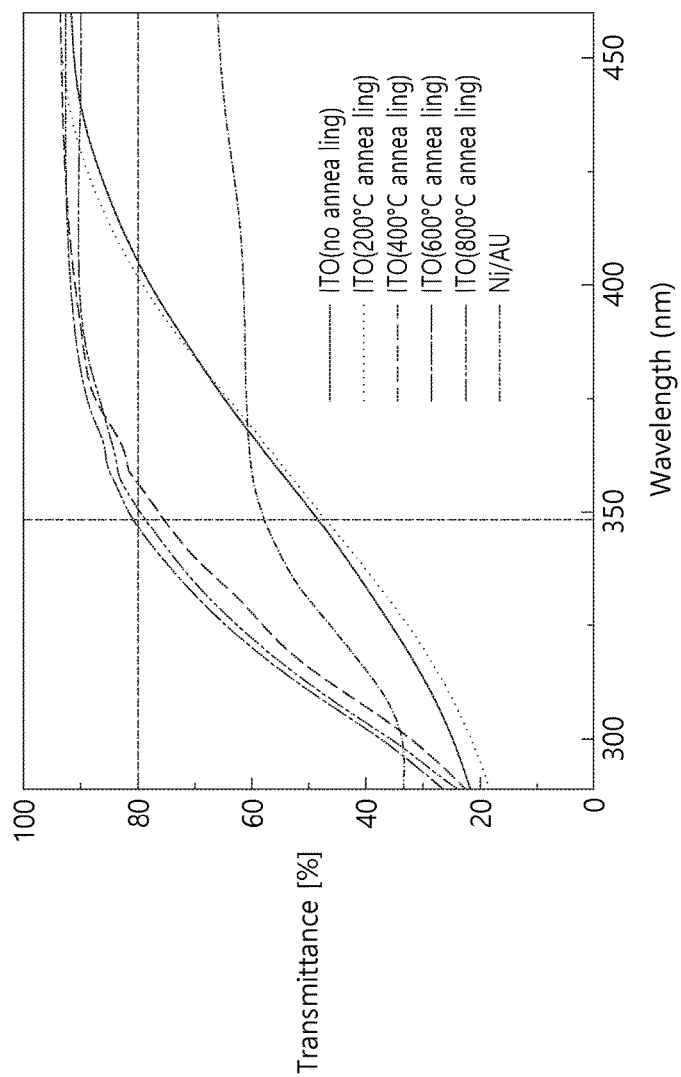
FIG. 1 is a diagram showing transmittance in an LED structure according to a conventional technology.

Hereinafter, embodiments of the subject application are described in detail with reference to the accompanying drawings so that the embodiments may be easily practiced by a person having ordinary skill in the art to which the subject application pertains. However, the subject application may be modified in various different ways and is not limited to the embodiments described herein. Furthermore, in the drawings, in order to clarify a description of the subject application, a part not related to the description is omitted, and similar reference numbers are used throughout the specification to refer to similar parts.

Throughout the entire specification of the subject application, when it is described that one member is "connected" to the other member, the one member may be "directly connected" to the other member or may be "electrically connected" to the other member through a third member.

Throughout the entire specification of the subject application, when it is described that one member is located "on" the other member, the one member may adjoin the other member or a third member may be present between the two members.

Throughout the entire specification of the subject application, when it is said that one member "comprises" the other member, the word "comprise" will be understood to imply the inclusion of stated members but not the exclusion of any other members, unless explicitly described to the contrary. The term "degree", such as "about" or "substantially" used in the entire specification of the subject application, is used in a corresponding numerical value or used as a meaning close to the numerical value when a unique manufacturing and substance permission error are presented in a described meaning, and is used to prevent an unconscientious infringer from illegally using disclosed contents including an accurate or absolute numerical value in order to help understanding of the present invention. The term "degree", such as a "step ~ (performing or doing)" or a "step of ~" used in the entire specification of the subject application, does not mean a "step for ~."

The subject application relates to a semiconductor device and a method for manufacturing the same.

A semiconductor device (hereinafter referred to as "the subject semiconductor device") according to an embodiment of the subject application is described below.

Figure 2:
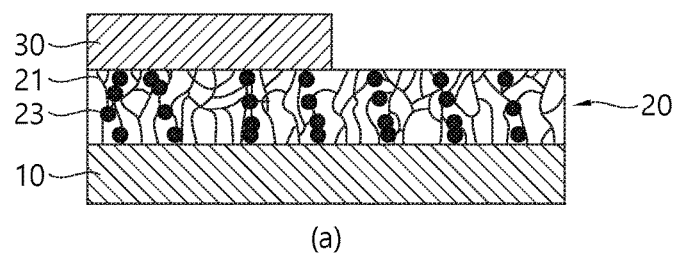
FIG. 2(a) is a schematic cross-sectional view of a semiconductor device according to an embodiment of the subject application, which has been shown to describe a channel formed to connect one side and the other side of a transparent electrode.
FIG. 2(b) is a schematic cross-sectional view of the semiconductor device according to an embodiment of the subject application, which has been shown to describe the channel extended up to the inside of the semiconductor layer coming into contact with the other side of the transparent electrode.
Figure 2:
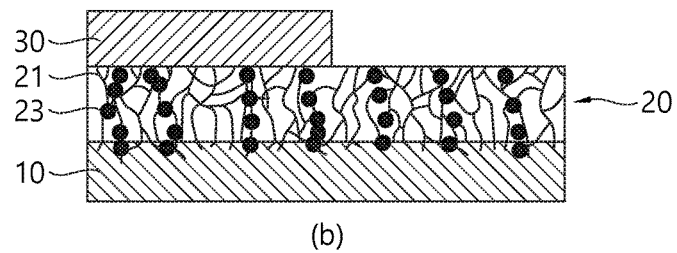
Figure 3:
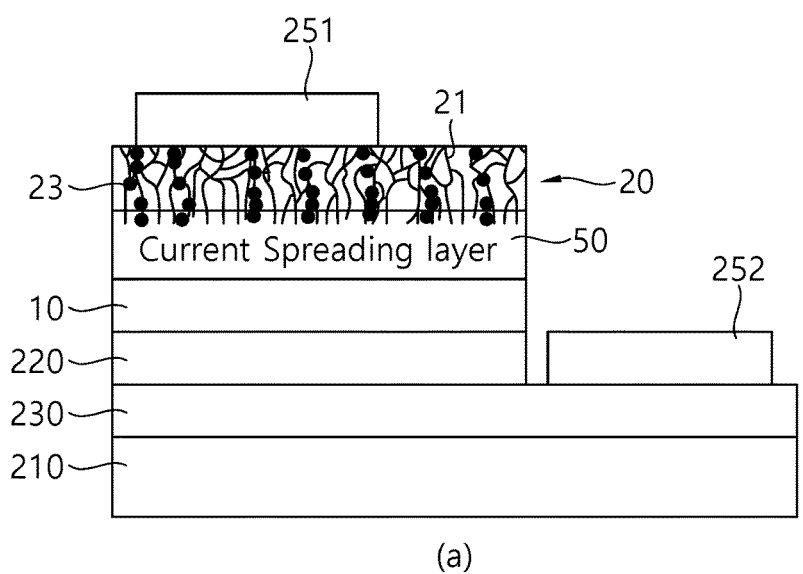
FIG. 3 is a cross-sectional view schematically showing a light-emitting device including the semiconductor device according to an embodiment of the subject application in order to describe a current spreading layer.
Figure 3:
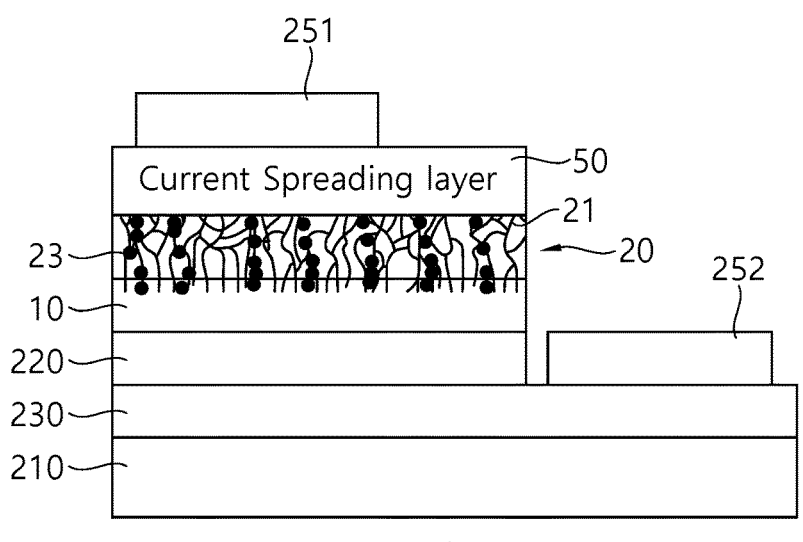

FIG. 2(a) is a schematic cross-sectional view of a semiconductor device according to an embodiment of the subject application, which has been shown to describe a channel formed to connect one side and the other side of a transparent electrode, FIG. 2(b) is a schematic cross-sectional view of the semiconductor device according to an embodiment of the subject application, which has been shown to describe the channel extended up to the inside of the semiconductor layer coming into contact with the other side of the transparent electrode, and FIG. 3 is a cross-sectional view schematically showing a light-emitting device including the semiconductor device according to an embodiment of the subject application in order to describe a current spreading layer.

Referring to FIG. 2, the subject semiconductor device includes a semiconductor layer 10 and a transparent electrode 20.

The semiconductor layer 10 may include both an inorganic semiconductor layer and an organic semiconductor layer and may also include all of substances through which charges may flow.

The inorganic semiconductor layer includes a single element semiconductor formed of a single element, such as Si and Ge. Furthermore, the inorganic semiconductor layer may include a compound semiconductor layer, such as a nitride-series compound semiconductor layer (GaN, AlGaN, InN, InGaN, AlN, etc.) and an oxide-series compound semiconductor layer (GaO, ZnO, CoO, IrO2, Rh2O3, Al2O3, SnO, etc.). The inorganic semiconductor layer may representatively include a substance that forms the electron injection layer and electron transport layer of an Organic Light-Emitting Diode (OLED).

As shown in FIG. 2, the transparent electrode 20 is formed on one side of the semiconductor layer 10.

The transparent electrode 20 is made of a resistance change substance.

By way of example, the transparent electrode 20 may be made of a resistance change substance of a transparent material whose resistance state is changed by an electric field applied thereto. Such a resistance change substance is chiefly used in a Resistive RAM (ReRAM) field. When a voltage of a unique threshold (threshold voltage) or more is applied, the resistance change substance is subjected to electro-forming. The resistance state of the resistance change substance, that is, an insulator, changes from a high resistance state to a low resistance state at first, and thus the resistance change substance has conductivity.

Furthermore, referring to FIG. 2, the transparent electrode 20 includes conductive paths 21 formed by applying a voltage of a threshold voltage or more.

When a voltage of a threshold voltage or more is applied to the resistance change substance, that is, an insulator, electro-forming is performed on the resistance change substance, and an electrode metal substance is inserted into a thin film by electrical stress (forming process) or the conductive paths (conductivity filaments or metallic filaments) 21 are formed within the resistance change substance by a defect structure within the thin film. Thereafter, although the voltage applied to the resistance change substance is removed, the conductive paths 21 are maintained, and an electric current flows through the conductive paths 21. Accordingly, the resistance state of the resistance change substance can maintain a low resistance state.

As will be described later in detail, referring to FIG. 2, the conductive paths 21 plays matchmaker to electrically connect a metal electrode pad 30 formed on the other side of the transparent electrode 20 and the semiconductor layer 10 formed on one side of the transparent electrode 20. Accordingly, the transparent electrode 20 and the semiconductor layer 10 may be subject to an ohmic contact.

The ohmic contact means a non-rectifying junction and refers to a case in which an I-V curve complies with Ohm's law (V=IR). In this case, the current I is not related to the direction of an electric field, but depends on only the size of the electric field. If an ohmic contact characteristic does not appear, a rectifying characteristic in which the current I depends on both the direction and size of an electric field may appear. Accordingly, a current in a specific direction may not flow. In the subject semiconductor device, however, the transparent electrode 20 and the semiconductor layer 10 can be subject to an ohmic contact through the conductive paths 21.

Furthermore, referring to FIG. 2, the transparent electrode 20 includes a channel on which electrons can hop (hereinafter referred to as a "channel") 23.

A threshold voltage at which the conductive paths 21 are formed can be lowered by the channel 23.

Electrons can hop in the channel 23. Accordingly, a threshold voltage for forming the conductive paths 21 may be lowered. In other words, if the channel 23 is formed, the conductive paths 21 may be formed with a low electric field because the value of a threshold voltage for forming the conductive paths 21 may be much low compared to a case where the channel 23 are not formed.

Accordingly, damage to the semiconductor device attributable to an electric field can be prevented.

Furthermore, the channel 23 can improve the uniformity of the conductive paths 21 and can further improve the ohmic contact characteristic of the semiconductor layer 10 and the transparent electrode 20.

Furthermore, field emission can be increased by the channel 23.

That is, in accordance with the subject semiconductor device, a transparent electrode which has high light transmittance with respect to light of an UV region of a short wavelength (in particular, UV rays of a wavelength region of 340 nm~280 nm and a wavelength region of 280 nm or less) in addition to a visible ray region and which can also have an excellent ohmic contact characteristic with respect to the semiconductor layer 10 due to high conductivity and a semiconductor device including the transparent electrode can be implemented. Furthermore, in accordance with the subject semiconductor device, a voltage to be applied to the transparent electrode 20 in order to form the conductive paths 21 can be lowered, and the uniformity of the conductive paths 21 can be improved. Accordingly, a semiconductor device having improved reliability and conductivity can be implemented.

The elements related to the subject semiconductor device are described in detail below.

The conductive paths 21 may be formed by a voltage of a threshold voltage or more applied to a metal electrode for forming (not shown), which is formed on one side of the transparent electrode 20.

By applying a voltage of a unique threshold voltage or more to the transparent electrode 20 through the metal electrode for forming, the conductive paths 21 may be formed within the transparent electrode 20, and thus the resistance state of the transparent electrode 20 may be changed from a high resistance state to a low resistance state.

Furthermore, referring to FIG. 2, the subject semiconductor device may include the metal electrode pad 30 formed on one side of the transparent electrode 20.

Referring to FIG. 2, a current implanted through the metal electrode pad 30 may be implanted into the entire region of the semiconductor layer 10 through the conductive paths 21 within the transparent electrode 20. In other words, the conductive paths 21 may play matchmaker to electrically connect the metal electrode pad 30 and the semiconductor layer 10.

The metal electrode for forming may be removed after the conductive paths 21 are formed. Furthermore, the metal electrode pad 30 may be formed after the metal electrode for forming is removed. Alternatively, as another implementation example, after the conductive paths 21 are formed, the metal electrode for forming may not be removed, but the metal electrode pad 30 may be additionally formed on the metal electrode for forming.

As yet another implementation example, a single electrode pad may play the role of the metal electrode for forming and the metal electrode pad 30. For example, the conductive paths 21 may be formed by applying a voltage of a threshold voltage or more to the transparent electrode 20 using the single electrode pad as the metal electrode for forming. Furthermore, after the conductive paths 21 are formed, a current may be implanted into the semiconductor layer 10 using the electrode pad, used as the metal electrode for forming, as the metal electrode pad 30.

Meanwhile, the channel 23 may be formed by an ion implantation method.

In general, the ion implantation method is a method used to add impurities (dopant) to a semiconductor device and is evident to those skilled in the art, and a detailed description thereof is omitted. The channel 23 may be formed by implanting ions into the transparent electrode 20 by the ion implantation method.

Furthermore, the channel 23 may be formed to connect one side and the other side of the transparent electrode 20.

Electrons can easily hop between one side and the other side of the transparent electrode 20 along the channel 23. Furthermore, field emission can be increased by the channel 23.

Furthermore, referring to FIGS. 2(*b*) and 3, the channel 23 may be extended from the other side of the transparent electrode 20 to the inside of a layer that comes into contact with the other side of the transparent electrode 20 so that an ohmic contact characteristic between the layer coming into contact with the other side of the transparent electrode 20 and the transparent electrode 20 is improved.

Accordingly, a potential barrier between the transparent electrode 20 and the layer coming into contact with the other side of the transparent electrode 20 can be lowered, and field emission can be increased. Accordingly, a contact characteristic can be improved.

Furthermore, referring to FIGS. 2(*b*) and 3, since the channel 23 is extended, the conductive paths 21 can be extended from the other side of the transparent electrode 20 to the layer coming into contact with the transparent electrode 20.

By way of example, as shown in FIG. 2(*b*), the layer coming into contact with the other side of the transparent electrode 20 may be the semiconductor layer 10. In other words, as shown in FIG. 2(*b*), the channel 23 may be extended from the other side of the transparent electrode 20 to the inside of the semiconductor layer 10.

However, the layer coming into contact with the other side of the transparent electrode 20 is not limited to the semiconductor layer 10 only. For example, referring to FIG. 3(*a*), the layer coming into contact with the other side of the transparent electrode 20 may be a current spreading layer 50 (to be described later).

In accordance with the ion implantation method, the depth at which ions are implanted can be controlled. That is, referring to FIG. 2, the channel 23 may be extended up to the inside of the layer coming into contact with the other side of the transparent electrode 20 by implanting ions into the inside of the layer coming into contact with the other side of the transparent electrode 20 through control of the depth at which ions are implanted (the depth in the up/down directions).

Furthermore, the semiconductor layer 10 may be doped with one or more of an n type and a p type.

If the transparent electrode 20 comes into contact with the n-doping portion of the semiconductor layer 10, the channel 23 may be formed by the implantation of n type ions.

Alternatively, if the transparent electrode 20 comes into contact with the p-doping portion of the semiconductor layer 10, the channel 23 may be formed by the implantation of p type ions.

In other words, the channel 23 may be formed by implanting ions advantageous for an ohmic contact depending on the p/n type of the semiconductor layer 10. Accordingly, an ohmic contact characteristic can be maximized.

By way of example, if the semiconductor layer 10 is coated with a p type, for example, if the semiconductor layer 10 is p-type GaN, the channel 23 may be formed because magnesium ions are implanted into the transparent electrode 20 by an ion implantation method. Accordingly, an ohmic contact characteristic between the transparent electrode 20 and the semiconductor layer 10 can be maximized.

Furthermore, the transparent electrode 20 may be formed using one or more of a transparent oxide-series substance, a transparent nitride-series substance, a transparent polymer-series substance, and a transparent nano substance.

By way of example, one or more of $SiO_2$, $Ga_2O_3$, $Al_2O_3$, ZnO, ITO, etc. may be used as the transparent conductivity oxide-series substance. Furthermore, one or more of $Si_3N_4$, AlN, GaN, InN, etc. may be used as the transparent conductivity nitride-series substance. Furthermore, one or more of polyaniline (PANI), poly (ethylenedioxythiophene)-polystyrene sulfonate (PEDOT: PSS), etc. may be used as the transparent conductivity polymer-series substance. Furthermore, one or more of CNT, CNT-oxide, graphene, graphene-oxide, etc. may be used as the transparent conductivity nano substance.

Furthermore, in addition to the aforementioned substances, a substance which is transparent and has the aforementioned resistance change characteristic may be used to form the transparent electrode 20 of the present invention. However, the meaning that the substances have conductivity means that they have conductivity by a forming process (a process of applying a voltage so that the conductive paths are formed).

Furthermore, referring to FIG. 3(a), the subject semiconductor device may include the current spreading layer 50 formed between the transparent electrode 20 and the semiconductor layer 10.

The current spreading layer 50 may interconnect the conductive paths 21 formed in the transparent electrode 20. Accordingly, a current concentration phenomenon can be prevented because a current introduced into the transparent electrode 20 can be diffused into the entire region of the semiconductor layer 10. In other words, the current spreading characteristic of the transparent electrode 20 can be improved.

The current spreading layer 50 may include a Carbon Nano Tube (CNT) layer or a grapheme layer.

CNT or graphene has excellent conductivity and light transmittance characteristics. In the present invention, the conductive paths 21 of the transparent electrode 20 are interconnected by forming the current spreading layer 50 on one side of the transparent electrode 20 using such characteristics. Accordingly, a current introduced into the transparent electrode 20 can be spread into the entire region of the semiconductor layer 10.

In this case, as the thickness of the current spreading layer 50 increases, CNTs or graphenes within the current spreading layer 50 are interconnected. Accordingly, the conductivity of the transparent electrode (20) is improved because the probability that the conductive paths 21 may be interconnected increases, but transmittance is reduced. Accordingly, it is preferred that the current spreading layer 50 of the present invention is formed as thin as possible within the limits to which the conductive paths 21 of the transparent electrode 20 are sufficiently interconnected, but transmittance is not reduced.

By way of example, the current spreading layer 50 may be formed in a thickness of about 2 nm to about 100 nm. For reference, 2 nm is a minimum thickness at which CNT or graphene may be formed into a single layer, and 100 nm is maximum thickness at which transmittance of light may be maintained to 80% more.

Furthermore, referring to FIG. 3(b), the subject semiconductor device may include the current spreading layer 50 formed between the metal electrode pad 30 and the transparent electrode 20.

The current spreading layer 50 formed between the metal electrode pad 30 and the transparent electrode 20 may enable a current applied from the metal electrode pad 30 to be applied to the transparent electrode 20 more uniformly. The current spreading layer 50 formed between the metal electrode pad 30 and the transparent electrode 20 may have an action and configuration similar to those of the current spreading layer formed between the aforementioned transparent electrode 20 and semiconductor layer 10.

That is, in the subject semiconductor device, the current spreading layer 50 may be formed on any of one side and the other side (top and bottom) of the transparent electrode 20.

The aforementioned subject semiconductor device may be applied to several optical elements, such as a lateral type LED device, a flip-chip LED device, a vertical type LED device, and an OLED device.

Furthermore, the transparent electrode 20 of the subject application may be changed in various ways depending on a semiconductor device to which the transparent electrode 20 is applied.

A method for manufacturing a semiconductor device (hereinafter referred to as "the subject method for manufacturing a semiconductor device") according to an embodiment of the subject application is described below. However, the same reference numerals are used in elements that are similar to or identical with the aforementioned elements, and a redundant description is simply given or omitted.

Figure 4:
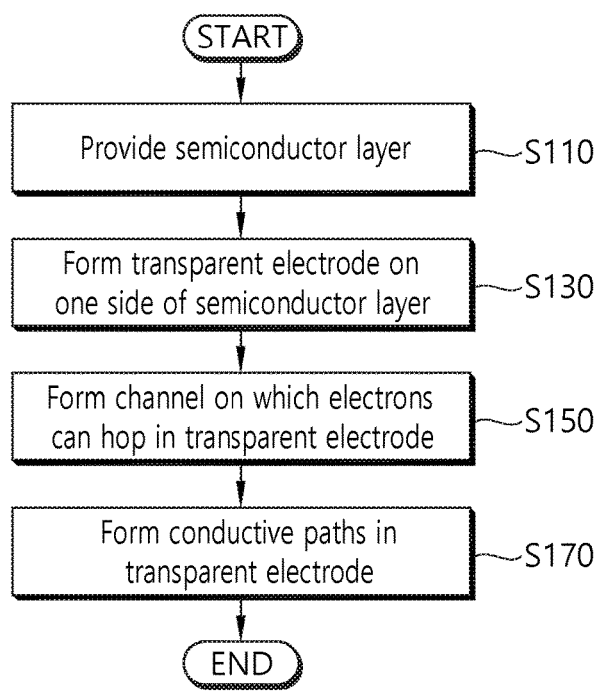
FIG. 4 is a flowchart showing a method for manufacturing a semiconductor device according to an embodiment of the subject application.
Figure 5:
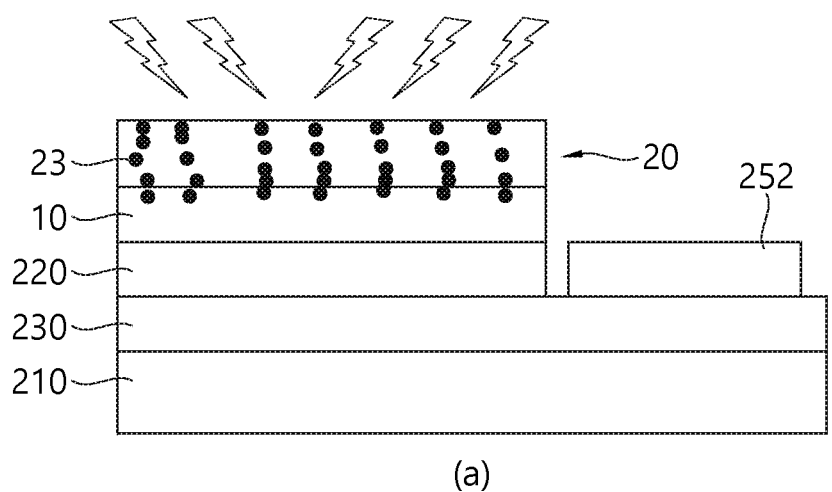
FIG. 5 is a conceptual diagram for illustrating a method for manufacturing a semiconductor device according to an embodiment of the subject application.
Figure 5:
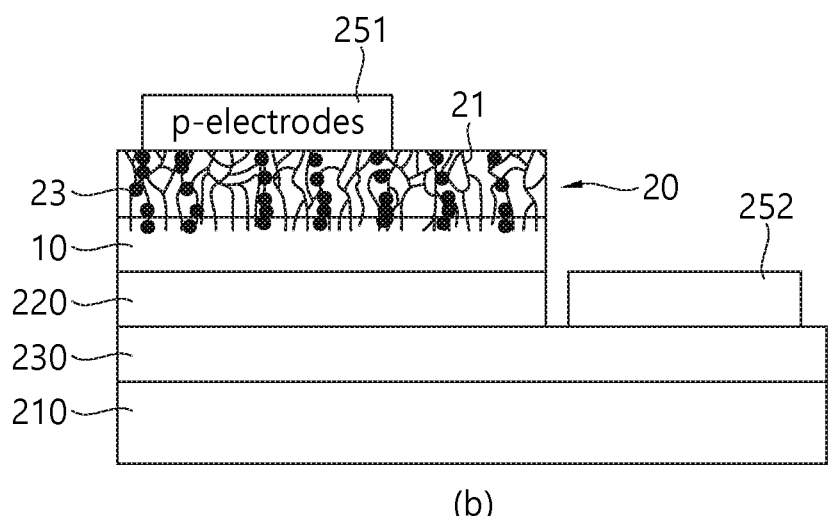

FIG. 4 is a flowchart showing a method for manufacturing a semiconductor device according to an embodiment of the subject application, and FIG. 5 is a conceptual diagram for illustrating a method for manufacturing a semiconductor device according to an embodiment of the subject application.

Referring to FIG. 4, the subject method for manufacturing a semiconductor device includes step S110 of providing the semiconductor layer 10.

Furthermore, referring to FIG. 4, the subject method for manufacturing a semiconductor device includes step S130 of forming the transparent electrode 20 made of the resistance change substance on one side of the semiconductor layer 10.

In other words, the transparent electrode 20 may be formed on one side of the semiconductor layer 10 by forming the resistance change substance layer on one side of the semiconductor layer 10.

Furthermore, referring to FIGS. 4 and 5(a), the subject method for manufacturing a semiconductor device includes step S150 of forming the channel 23 on which electrons can hop in the transparent electrode 20.

Furthermore, referring to FIGS. 4 and 5(b), the subject method for manufacturing a semiconductor device includes step S170 (a forming process of forming the conductive paths 21 by applying a voltage of a threshold voltage or more to the transparent electrode 20 in which the channel 23 has been formed.

By way of example, as shown in FIGS. 4 and 5, after step S150 of forming the channel 23 is performed (refer to FIG. 5(a)), step S170 of forming the conductive paths 21 may be performed (refer to FIG. 5(b)).

Furthermore, as described above, the channel 23 lowers a threshold voltage at which the conductive paths are formed.

That is, if the channel 23 is formed, the value of a threshold voltage for forming the conductive paths 21 can be much lowered compared to a case where the channel 23 are not formed. Accordingly, in accordance with the subject method for manufacturing a semiconductor device, the conductive paths 21 may be formed with a low electric field.

Furthermore, the channel 23 can improve the uniformity of the conductive paths 21. In other words, the channel 23 may enable the conductive paths 23 to be scattered. Accordingly, a semiconductor device in which the spreading of a current, introduced into the transparent electrode 20, to the entire region of the semiconductor layer 10 can be fabricated. Furthermore, a semiconductor device in which an ohmic contact characteristic between the semiconductor layer 10 and the transparent electrode 20 is maximized because the channel 23 is included can be fabricated.

The elements related to the subject method for manufacturing a semiconductor device are described in detail below.

At step S150 of forming the channel 23, the channel 23 may be formed to connect one side and the other side of the transparent electrode 20.

Furthermore, at step S150 of forming the channel 23, the channel 23 may be extended from the other side of the transparent electrode 20 to the inside of a layer coming into contact with the other side of the transparent electrode 20 so that an ohmic contact characteristic between the layer coming into contact with the other side of the transparent electrode 20 and the transparent electrode 20 is improved.

Furthermore, the layer coming into contact with the other side of the transparent electrode 20 may be the semiconductor layer 10.

At step S150 of forming the channel 23, the channel 23 may be formed by an ion implantation method.

Furthermore, at step S150 of forming the channel 23, the channel 23 may be formed at a specific point only. By way of example, after a photoresist pattern is formed in accordance with the specific point, the channel 23 may be formed at the specific point only by performing ion implantation.

Meanwhile, step S170 of forming the conductive paths 21 may include a step of forming the metal electrode for forming on the other side of the transparent electrode 20.

Step S170 of forming the metal electrode for forming may include the steps of stacking a photoresist PR on the other side of the transparent electrode 20, forming an electrode pattern on the photoresist, and removing the photoresist.

More specifically, a photoresist layer may be formed on the other side of the transparent electrode 20, and an electrode pattern for forming may be formed on the photoresist layer by exposing and developing the location where an electrode (for performing forming) for forming the conductive paths will be formed using a mask. In this case, the electrode pattern may be formed to include at least two electrodes in order to apply a voltage. Next, the inside of the electrode pattern may be filled by depositing metal on the photoresist layer on which the electrode pattern has been formed and the photoresist layer may be removed by performing a lift-off process, thereby being capable of forming the metal electrode for forming for forming the conductive paths 21. However, such a process is an embodiment, and the metal electrode for forming may be formed through various processes.

Furthermore, step S170 of forming the conductive paths 21 may include a step of applying a voltage of a threshold voltage or more through the metal electrode for forming.

When a voltage of a unique threshold voltage or more is applied to the transparent electrode 20 made of the resistance change substance through the metal electrode for forming, the conductive paths 21 may be formed within the transparent electrode 20 made of the resistance change substance. Accordingly, the resistance state of the transparent electrode 20 may change from a high resistance state to a low resistance state. In this case, the conductive paths 21 may travel in a vertical direction (up/down direction) within the transparent electrode 20 or may travel in a horizontal direction.

By way of example, the metal electrode for forming may be formed on the other side of the transparent electrode 20.

Furthermore, the subject method for manufacturing a semiconductor device may include a step of removing the metal electrode for forming after performing step S170 of forming the conductive paths 21.

Furthermore, the subject method for manufacturing a semiconductor device may include a step of forming the current spreading layer 50 on the other side of the transparent electrode 20 after performing step S170 of forming the conductive paths 21.

Furthermore, the subject method for manufacturing a semiconductor device may include a step of forming the metal electrode pad 30 on the current spreading layer 50 after performing step S170 of forming the conductive paths 21.

That is, in accordance with the subject method for manufacturing a semiconductor device, after the conductive paths 21 are formed, the metal electrode for forming may be removed, the current spreading layer 50 may be formed on the other side of the transparent electrode 20 from which the metal electrode for forming has been removed, and the metal electrode pad 30 may be formed on the formed current spreading layer 50.

If the current spreading layer 50 is not formed, the method of for ng the metal electrode pad 30 may include removing the metal electrode for forming and forming a separate metal electrode pad 30. Alternatively, the metal electrode pad 30 may be formed by additionally depositing metal on the metal electrode for forming using a mask.

As yet another implementation example, a single electrode pad may play the role of the metal electrode for forming and the metal electrode pad 30. For example, the conductive paths 21 may be formed by applying a voltage of a threshold voltage or more to the transparent electrode 20 using the single electrode pad as the metal electrode for forming. Furthermore, after the conductive paths 21 are formed, a current may be injected into the semiconductor layer 10 using the electrode pad, used as the metal electrode for forming, as the metal electrode pad 30.

That is, in accordance with the subject method for manufacturing a semiconductor device, when the conductive paths 21 are formed in the transparent electrode 20, the metal electrode pad 30 may be formed.

The current spreading layer 50 may include a CNT layer or a graphene layer.

Furthermore, the subject method for manufacturing a semiconductor device may further include a step of forming the current spreading layer 50 combined with one side of the semiconductor layer 10 before the transparent electrode 20 is formed on one side of the semiconductor layer 10.

In other words, before the resistance change substance layer for forming the transparent electrode 20 is formed on one side of the semiconductor layer 10, the current spreading layer 50 may be formed on one side of the semiconductor layer 10. Accordingly, the current spreading layer 50 may be formed between the transparent electrode 20 and the semiconductor layer 10.

Furthermore, the current spreading layer 50 may include a CNT layer or a graphene layer.

Meanwhile, in the subject method for manufacturing a semiconductor device, the transparent electrode 20 may be subject to an ohmic contact with the semiconductor layer 10.

Furthermore, the semiconductor layer 10 may be doped with one or more of an n type and a p type.

If the transparent electrode 20 comes into contact with the n-doping portion of the semiconductor layer 10, the channel 23 may be formed by the implantation of n type ions. Furthermore, if the transparent electrode 20 comes into contact with the p-doping portion of the semiconductor layer 10, the channel 23 may be formed by the implantation of p type ions.

Furthermore, the transparent electrode 20 may be made of one or more of a transparent oxide-series substance, a transparent nitride-series substance, a transparent polymer-series substance, and a transparent nano substance.

The method for manufacturing a semiconductor device according to an embodiment of the subject application has been described so far. In accordance with the subject method for manufacturing a semiconductor device, the transparent electrode 20 may be applied to all of transparent electrodes that come in contact with the semiconductor layer 10, and may be changed in various ways depending on a semiconductor device to which a transparent electrode is applied. By way of example, in the aforementioned subject method for manufacturing a semiconductor device, the transparent electrode 20 has been illustrated as being formed on the semiconductor layer 10. In the case of an Organic Light Emitting Diode (OLED), however, after the transparent electrode 20 is formed on a glass substrate and the channel 23 and the conductive paths 21 are formed, the transparent electrode 20 may come into contact with the semiconductor layer 10, thereby being capable of forming the semiconductor device.

That is, unlike in that shown in FIG. 4, the semiconductor device may be formed in such a manner that the transparent electrode is formed on a substrate other than the semiconductor layer 10, the channel 23 is formed, the conductive paths 21 are formed, the substrate is removed, and the transparent electrode 20 is brought in contact with the semiconductor layer 10. In accordance with such a method, the semiconductor device may be fabricated by combining the transparent electrode 20 and the semiconductor layer 10 after the process of forming the transparent electrode 20 and the process of forming the semiconductor layer 10 are separately performed.

A light-emitting device according to an embodiment of the subject application (hereinafter referred to as "the subject light-emitting device") is described below. However, the same reference numerals are used in elements that are similar to or identical with the aforementioned elements, and a redundant description is simply given or omitted.

Figure 6:
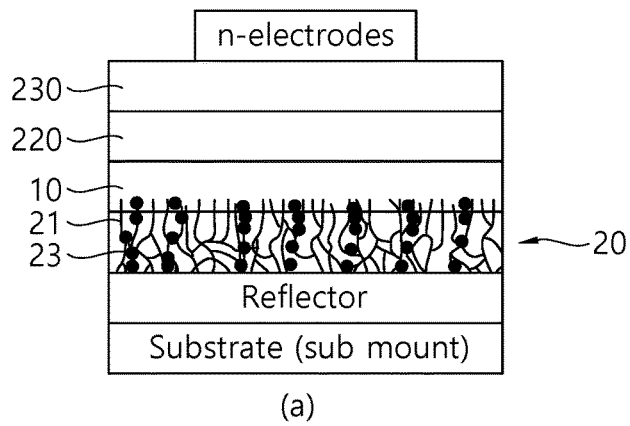
FIG. 6 is a cross-sectional view schematically showing a vertical type light-emitting device including a semiconductor device according to an embodiment of the subject application in order to describe the light-emitting device according to an embodiment of the subject application.
Figure 6:
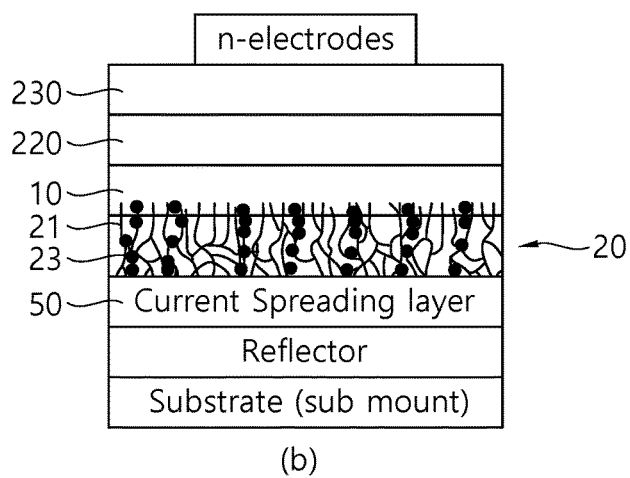
Figure 6:
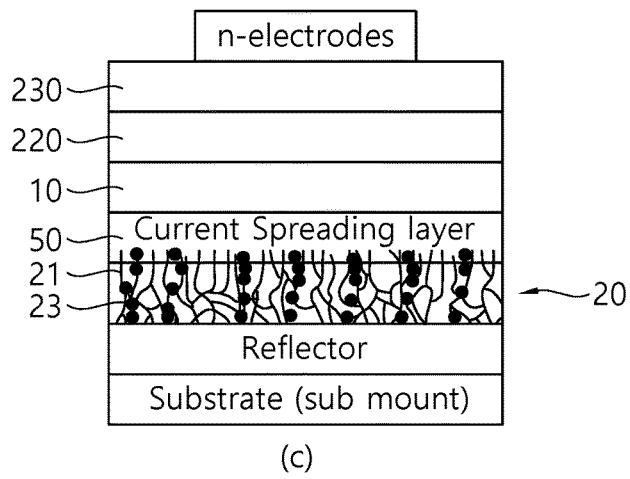
Figure 7:
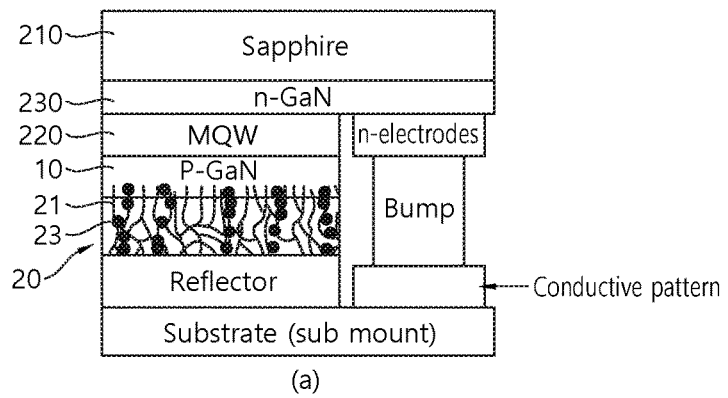
FIG. 7 is a cross-sectional view schematically showing a flip-chip type light-emitting device including a semiconductor device according to an embodiment of the subject application in order to describe the light-emitting device according to an embodiment of the subject application.
Figure 7:
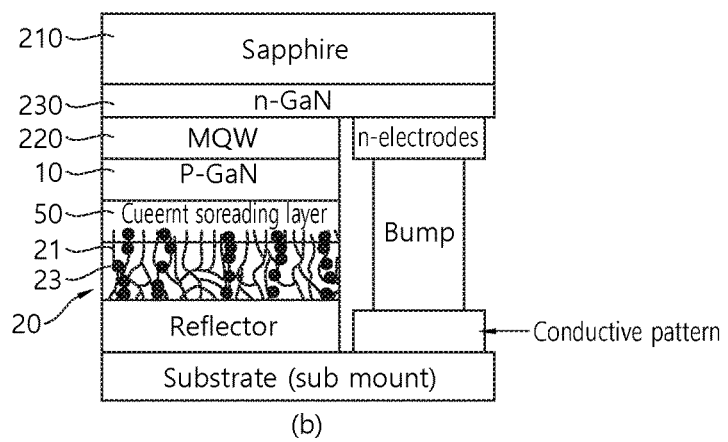
Figure 7:
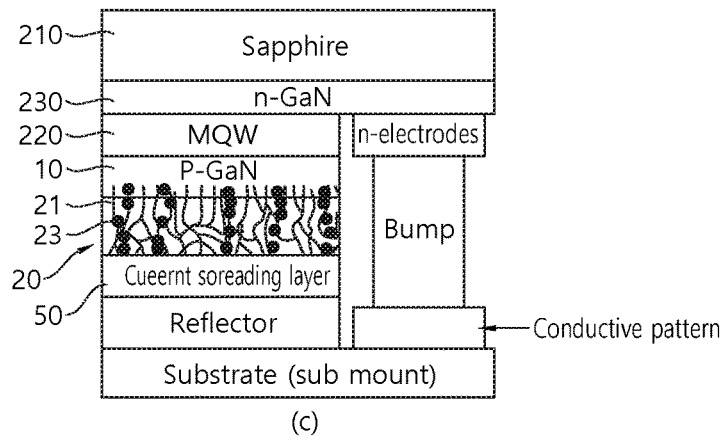
Figure 8:
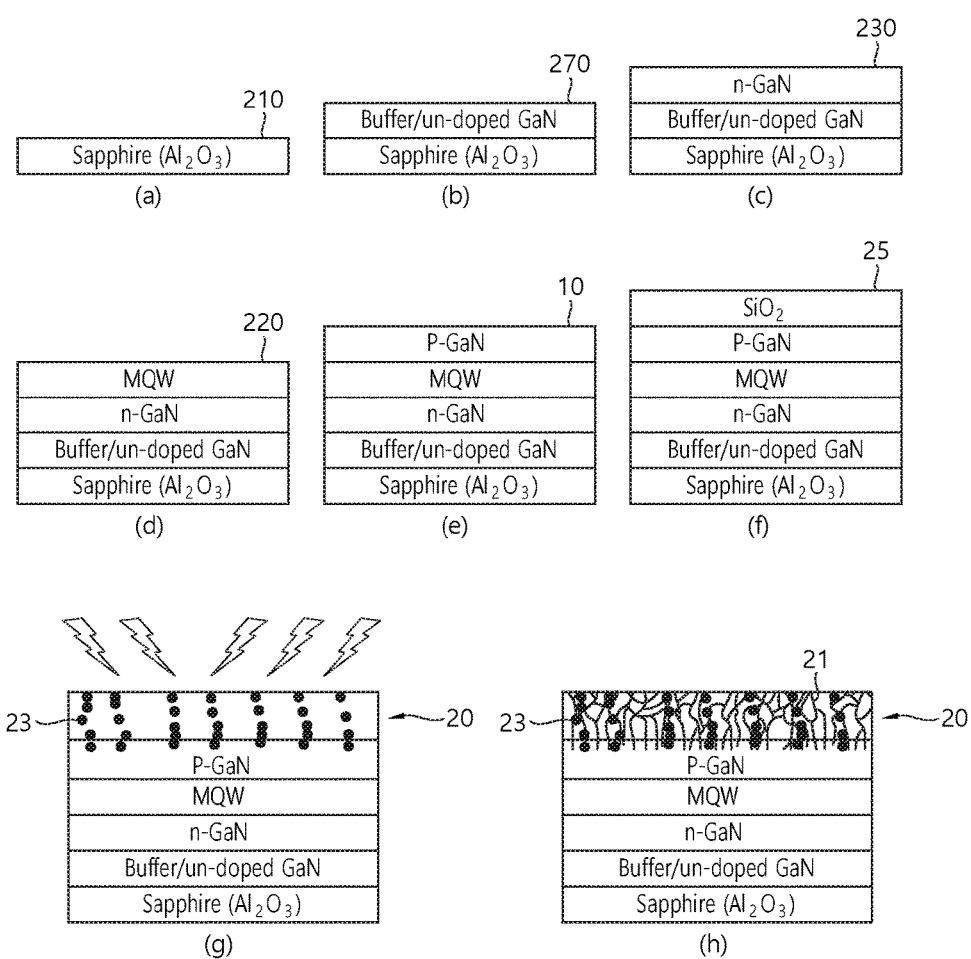
FIG. 8 is a conceptual diagram for illustrating a method for manufacturing a light-emitting device according to an embodiment of the subject application.

FIG. 6 is a cross-sectional view schematically showing a vertical type light-emitting device including a semiconductor device according to an embodiment of the subject application in order to describe the light-emitting device according to an embodiment of the subject application, FIG. 7 is a cross-sectional view schematically showing a flip-chip type light-emitting device including a semiconductor device according to an embodiment of the subject application in order to describe the light-emitting device according to an embodiment of the subject application, and FIG. 8 is a conceptual diagram for illustrating a method for manufacturing a light-emitting device according to an embodiment of the subject application.

The subject light-emitting device includes the aforementioned semiconductor device according to an embodiment of the subject application.

More specifically, referring to FIG. 3, the subject light-emitting device may include the semiconductor layer 10 and the transparent electrode 20. Furthermore, the transparent electrode 20 is made of a resistance change substance, and may include the channel 23 on which electrons can hop and the conductive paths 21 formed when a voltage of a threshold voltage or more is applied.

Furthermore, as shown in FIG. 3, the subject light-emitting device may include a substrate 210. The substrate 210 may be a growth substrate generally used to form a light-emitting device, such as a sapphire substrate.

Furthermore, referring to FIGS. 6 and 7, the subject light-emitting device may include a sub-mount substrate. The sub-mount substrate may be a metal substrate into which a current may be injected.

Furthermore, referring to FIGS. 6 and 7, the subject light-emitting device may include a reflector. The reflector may reflect light generated from an active layer MOW. Such a reflector may be formed of Ag, Al, Pt, Au, Ni, Ti, ITO or a combination of time.

Furthermore, referring to FIGS. 3, 6, and 7, the subject light-emitting device may include an active layer MOW 220. The active layer 220 may preferably be made of Al (In) GaN/(In)GaN so that light of an UV region is generated, but is not limited to any material if the material can generate light of an UV region.

Furthermore, referring to FIGS. 3, 6, and 7, the subject light-emitting device may include a second semiconductor layer 230. The semiconductor layer 10 and the second semiconductor layer 230 may be doped with an n type and a p type, respectively. Alternatively, the semiconductor layer 10 and the second semiconductor layer 230 may be doped with a p type and an n type, respectively. By way of example, as shown in FIGS. 6 and 7, the semiconductor layer 10 may be doped with p-GaN, and the second semiconductor layer 230 may be doped with n-GaN.

By way of example, referring to FIG. 3, when a current is introduced through an electrode pad 251, the introduced current is spread into the entire region through the conductive paths 21 within the transparent electrode 20 and introduced into the entire region of the semiconductor layer 10. Accordingly, electrons (or holes) supplied from the semiconductor layer 10 and holes (or electrons) supplied from the second semiconductor layer 230 may be combined in the active layer 220 to generate light. Furthermore, the generated light may be drained to the outside through the transparent electrode 20. In particular, light that belongs to pieces of light generated from the active layer 220 and that has an UV region may be drained to the outside.

Furthermore, e, referring to FIGS. 3, 6(*b*), 6(*c*), 7(*b*), and 7(*c*), the subject light-emitting device may include the current spreading layer 50. FIG. 3(*a*) shows an example in which the current spreading layer 50 has been formed between the transparent electrode 20 and the semiconductor layer 10, and FIG. 3(*b*) shows an example in which the current spreading layer 50 has been formed on a side opposite a side that comes into contact with the semiconductor layer 10 of the transparent electrode 20. Alternatively, as shown in FIGS. 6(*b*) and 7(*c*), the current spreading layer 50 may be formed between the transparent electrode 20 and the reflector. Alternatively, as shown in FIGS. 6(*c*) and 7(*b*), the current spreading layer 50 may be formed between the transparent electrode 20 and the semiconductor layer 10.

That is, the current spreading layer 50 may be formed to come into contact with the transparent electrode 20 on one side or the other side of the transparent electrode 20.

The current spreading layer 50 can improve a current spreading characteristic of the transparent electrode 20 as described above. By way of example, the current spreading layer 122 may include one or more of CNT and graphene.

CNT or graphene has excellent conductivity and light transmittance. In accordance with the subject light-emitting device, a current introduced into the transparent electrode 20 is spread into the entire region of the semiconductor layer 10 because the conductive paths 21 of the transparent electrode 20 are interconnected through the current spreading layer 50 made of such CNT or graphene.

Meanwhile, the light-emitting device of FIG. 6 according to an implementation example of the subject application may be implemented by adding the transparent electrode 20 to a common vertical type light-emitting device. By way of example, the transparent electrode 20 may have been added between the reflector and the semiconductor layer (by way of example, referring to FIG. 7(*a*), a p-GaN layer).

Furthermore, the light-emitting device of FIG. 7 according to an implementation example of the subject application may be implemented by adding the transparent electrode 20 to a conventional light-emitting device of a flip-chip structure.

Meanwhile, FIG. 8 is a conceptual diagram for illustrating a method for manufacturing a light-emitting device according to an embodiment of the subject application.

Referring to FIG. 8, by way of example, the subject method for manufacturing a light-emitting device may be as follow.

Referring to FIG. 8(a), the subject method for manufacturing a light-emitting device may include a step of providing the substrate 210. By way of example, as shown in FIG. 8, the substrate 210 may be a sapphire substrate.

Furthermore, referring to FIG. 8(b), the subject method for manufacturing a light-emitting device may include a step of forming a buffer layer 270 on the substrate 210. The buffer layer 270 may be formed using undoped GaN so that the second semiconductor layer 230 is easily grown. The buffer layer 270 may be omitted, if necessary.

Furthermore, referring to FIG. 8(c), the subject method for manufacturing a light-emitting device may include a step of forming the second semiconductor layer 230 on the buffer layer 270. The second semiconductor layer 230 may be a semiconductor layer doped with an n type. By way of example, the second semiconductor layer 230 may be formed using n-GaN so that light of an UV region is generated, but may be made of a material which can generate light of an UV region and is used to fabricate a light-emitting device.

Furthermore, referring to FIG. 8(d), the subject method for manufacturing a light-emitting device may include a step of forming the active layer 220 on the second semiconductor layer 230.

Furthermore, referring to FIG. 8(e), the subject method for manufacturing a light-emitting device may include a step of forming the semiconductor layer 10 on the active layer 220. As shown in FIG. 8, the semiconductor layer 10 may be a semiconductor layer doped with a p type. By way of example, the semiconductor layer 10 may be formed using p-GaN, but may be made of a known material which can generate light of an UV region and is used to fabricate a light-emitting device.

Furthermore, referring to FIG. 8(f), the subject method for manufacturing a light-emitting device may include a step of forming the resistance change substance layer 25 for forming the transparent electrode 20 on the semiconductor layer 10.

Furthermore, the subject method for manufacturing a light-emitting device may include a step of forming the channel 23 in the resistance change substance layer 25, as shown in FIG. 8(g). Furthermore, the subject method for manufacturing a light-emitting device may include a step of forming the conductive paths 21 in the resistance change substance layer 25, as shown in FIG. 8(h).

A light-emitting device according to an embodiment of the subject application (hereinafter referred to as "the subject light-emitting device") is described below.

Figure 9:
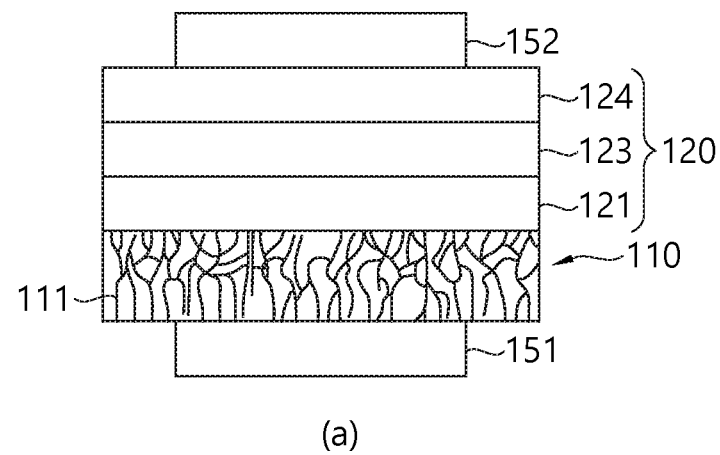
FIG. 9(a) is a schematic cross-sectional view for illustrating a common type light-emitting device according to an embodiment of the subject application.
FIG. 9(b) is a schematic cross-sectional view for illustrating a vertical type light-emitting device according to an embodiment of the subject application.
Figure 9:
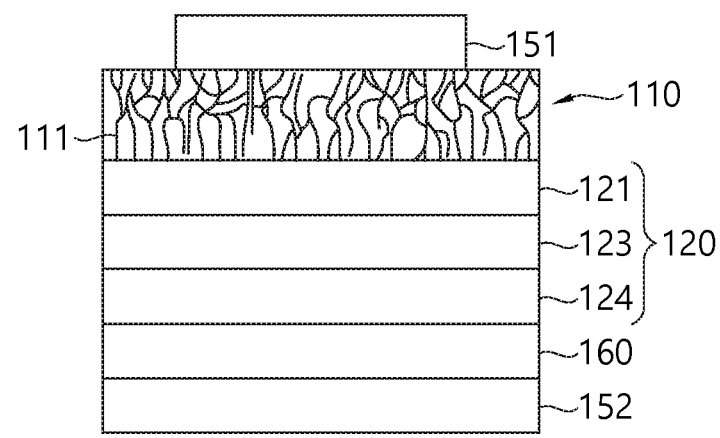

Referring to FIG. 9, the subject light-emitting device includes a growth substrate 110, a light-emitting unit 120, and an electrode pad 151.

As shown in FIG. 9, the light-emitting unit 120 is formed on one side of the growth substrate 110.

The light-emitting unit 120 may emit light. An example of the detailed sub-elements of the light-emitting unit 120 is described later.

Furthermore, referring to FIG. 9, the electrode pad 151 is formed on the other side of the growth substrate 110.

The electrode pad 151 may supply a current.

Referring to FIG. 9, the growth substrate 110 includes conductive paths 111 formed by applying a voltage of a threshold voltage or more so that the electrode pad 151 and the light-emitting unit 120 are electrically connected.

The conductive paths 111 may be formed using electrical breakdown (EBD) by applying a voltage of a threshold voltage or more to the growth substrate 110.

More specifically, when a voltage of a threshold voltage or more is applied to the growth substrate 110, electroforming is performed, so the conductive paths (conductivity filaments or metallic filaments) 111 are formed because an electrode metal substance is inserted into the growth substrate 110 by electrical stress (a forming process) or due to a defect structure within the growth substrate 110. Thereafter, although the voltage applied to the growth substrate 110 is removed, the conductive paths 111 remain intact, and thus a current can flow through such conductive paths 111. Accordingly, the resistance state of the growth substrate 110 can maintain a low resistance state.

That is, the conductive paths 111 may play matchmaker to electrically connect the electrode pad 151 and the light-emitting unit 120.

Accordingly, the light-emitting device in which the electrode pad 151 and the light-emitting unit 120 can be electrically connected although the growth substrate 110 is not removed can be implemented.

In general, a vertical type LED attracts great interest due to advantages of an efficient heat dissipation plate and optical power improvement. In fabricating such a vertical type LED, a Laser Lift-Off (LLO) process is performed to detach a growth substrate from a light-emitting unit. However, when such an LLO process is performed, a surface of the light-emitting unit is damaged. Accordingly, there is a problem in that efficiency of the vertical type LED is reduced.

Accordingly, conventionally, when a lift-off process is performed, chemical lift-off is performed or a surface of a growth substrate is patterned in order to minimize damage to a light-emitting unit. However, such a conventional method may also deteriorate the characteristics of an LED.

In the subject light-emitting device, however, the electrode pad 151 and the light-emitting unit 120 can be electrically connected by forming the conductive paths in the growth substrate 110. Accordingly, a process for manufacturing the subject light-emitting device can be simple and a process time and costs can be significantly reduced because the growth substrate 110 does not need to be removed in the manufacturing process.

Elements related to the subject light-emitting device are described in detail below.

Referring to FIG. 9, the light-emitting unit 120 may include a first semiconductor layer 121, an active layer 123, and a second semiconductor layer 124.

By way of example, the first semiconductor layer 121 may be subject to n-doping, and the second semiconductor layer 124 may be subject to p-doping. In this case, the first semiconductor layer 121 may supply electrons and the second semiconductor layer 124 may supply holes. The supplied electrons and holes may be combined in the active layer 123, thereby being capable of emitting light. By way of example, the first semiconductor layer 121 may be n-type GaN. Furthermore, the second semiconductor layer 124 may be p-type GaN. The light-emitting unit 120 is an element evident to those skilled in the art, and a detailed description thereof is omitted.

Furthermore, a voltage of a threshold voltage or more may be applied to an electrode for forming (not shown), which is formed on the other side of the growth substrate 110.

The electrode for forming may be removed when the conductive paths 111 are formed within the growth substrate 110. In this case, the aforementioned electrode pad 151 may be formed after the electrode for forming is removed.

Alternatively, as another implementation example, after the conductive paths 111 are formed, the electrode pad 151 may be formed on the electrode for forming.

As yet another implementation example, the electrode pad 151 may play the role of the electrode for forming. For example, the conductive paths 111 may be formed in the growth substrate 110 by applying a voltage of a threshold voltage or more to the growth substrate 110 using the electrode pad 151 as the electrode for forming. After the conductive paths 111 are formed, a current may be injected into the growth substrate 110 through the electrode pad 151.

Furthermore, the subject light-emitting device may include a second electrode pad 152.

By way of example, if the first semiconductor layer 121 is doped with an n type, the aforementioned electrode pad 151 may be an n type. If the second semiconductor layer 124 is doped with a p type, the second electrode pad 152 may be a p type.

Figure 12:
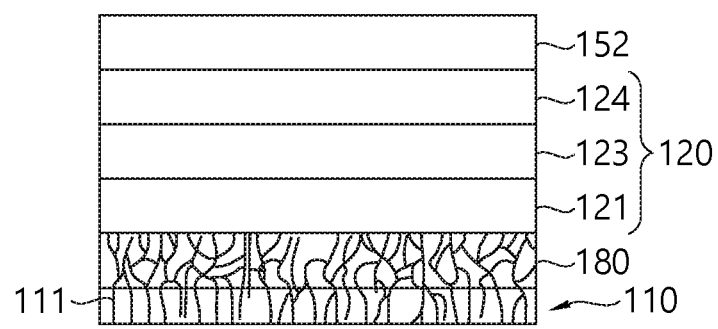
FIG. 12 is a schematic cross-sectional view of a light-emitting device for describing the extension and formation of a conductivity path according to an embodiment of the subject application.
Figure 12:
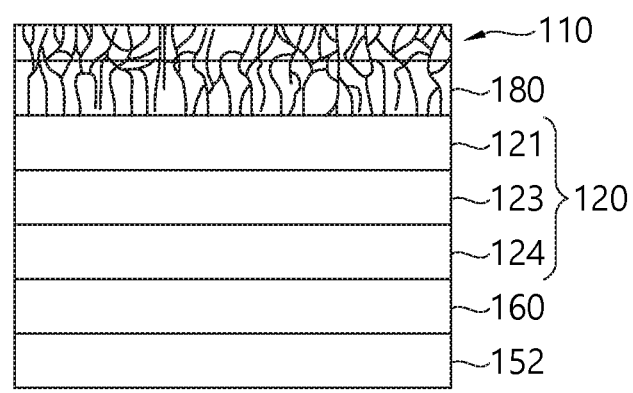

Furthermore, referring to FIG. 12, the conductive paths 111 may be extended in a layer formed on one side or the other side of the growth substrate 110 from the growth substrate 110.

By way of example, the conductive paths 111 may be extended to a buffer layer 180 formed on one side of the growth substrate 110, as shown in FIG. 12.

Meanwhile, by way of example, the growth substrate 110 may be a material including sapphire.

In general, the light-emitting unit 120 is formed by epitaxially growing it on the growth substrate 110. A substrate widely used as such a growth substrate 110 is a sapphire substrate, that is, an insulator. The sapphire substrate does not conduct electricity. Conventionally, in a process for manufacturing a light-emitting device, the light-emitting unit 120 (e.g., the first semiconductor layer 121) is etched so that part of the light-emitting unit 120 is exposed, and the electrode pad 151 is formed in the exposed light-emitting unit 120.

As described above, however, in accordance with the subject light-emitting device, a current can be applied to the light-emitting unit 120 through the growth substrate 110 because the conductive paths 111 through EBD can be formed within the growth substrate 110. Accordingly, a light-emitting device which is stable in terms of heat, structure, and cost can be manufactured.

Furthermore, the growth substrate 110 may be a material including one or more of SiO2, Si—O—C, Ga2O3 LiAlO2. ZnO, and LiGaO2 insulator substances. Alternatively, the growth substrate 110 may be a material including GaN.

Furthermore, the growth substrate 110 may have a structure in which a plurality of insulator layers has been stacked in a multi-layer.

At least two layers of the plurality of insulator layers may have different bandgaps. Furthermore, an insulator layer that belongs to the plurality of insulator layers and has a relatively small bandgap may be stacked so that it is close to the light-emitting unit 120.

In general, the conductivity and transmittance of a substance have a tradeoff relation. For example, a substance having transmittance high enough to be used in an UV region has a large bandgap. Accordingly, it is impossible to use the substance as an electrode because the substance has very low electrical conductivity to be used as an electrode and an ohmic contact between the substance and a semiconductor substance is not performed.

Accordingly, transmittance and conductivity can be traded off through a combination of multiple layers by forming the growth substrate 110 using the multiple layers having different bandgaps instead of forming the growth substrate 110 using a single layer having a constant bandgap.

By way of example, the conductive paths 111 can be formed more easily in an insulator layer having a relatively large bandgap than in an insulator layer having a relatively small bandgap. The multi-layer may be formed so that an insulator layer having a smaller bandgap is located closer to the light-emitting unit 120. In an insulator layer, however, a degree to which forming is performed (a degree to which the conductive paths are formed) may greatly vary depending on a condition, atmosphere, etc. in which an insulating film is laid for each insulating substance. Accordingly, a method of forming the multi-layer is not limited to the aforementioned example.

Furthermore, the plurality of insulator layers may be stacked so that a difference in the refractive index between the insulator layer and an external air layer is reduced toward the outside. Accordingly, light generated from the light-emitting unit 120 can be prevented from being totally reflected, totally reflected light can be prevented from entering the light-emitting unit 120 again, and light extraction efficiency can be improved.

Each of the plurality of insulator layers may include one or more of sapphire, SiO2, Si—O—C, Ga2O3 LiAlO2, ZnO, LiGaO2, and GaN.

If the growth substrate 110 has been formed by staking a plurality of insulator layers in a multi-layer, the conductive paths 111 may be formed by considering the multi-layer to be a single insulator.

Furthermore, an insulator layer that belongs to the plurality of insulator layers and that is on the outermost side corresponding to one side or the other side of the growth substrate 110 may have a greater defect than an insulator layer on the inner side.

The growth substrate 110 may include one or more of particles and oxygen defects in order to facilitate the formation of the conductive paths 111.

Figure 10:
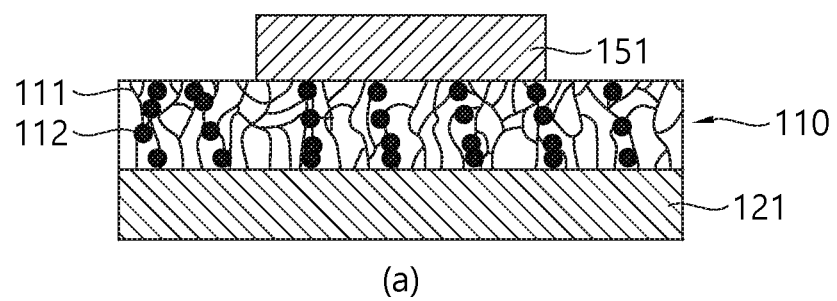
FIG. 10(a) is a schematic cross-sectional view showing an electrode pad, a growth substrate, and a first semiconductor layer in order to describe a channel formed to connect one side and the other side of the growth substrate.
FIG. 10(b) is a schematic cross-sectional view showing the electrode pad, the growth substrate, and the first semiconductor layer in order to described a channel extended up to the inside of the first semiconductor layer coming into contact with one side of the growth substrate.
Figure 10:
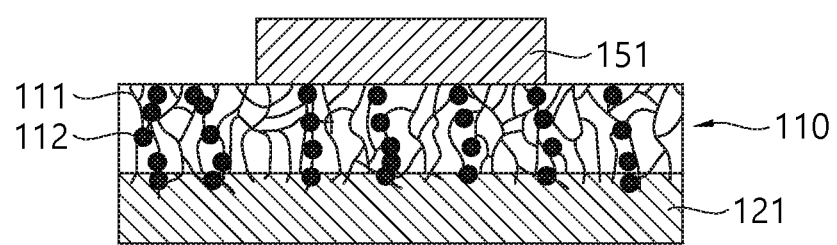

Furthermore, referring to FIG. 10, the growth substrate 110 may include a channel 112 on which electrons can hop. For reference, the channel 112 is shown in FIG. 10 only.

Electrons can hop in the channel 112. Accordingly, a threshold voltage for forming the conductive paths 111 can be lowered. In other words, if the channel 112 is formed, the conductive paths 112 can be formed with a low electric field because the value of a threshold voltage for forming the conductive paths 111 can be much lowered compared to a case where the channel 112 is not formed.

Accordingly, damage to the light-emitting device attributable to an electric field can be prevented because an electric field for forming the conductive paths 111 does not need to be strong.

Furthermore, the channel 112 can improve the uniformity of the conductive paths 111 and can further improve an ohmic contact characteristic between the growth substrate 110 and the light-emitting unit 120 (e.g., the first semiconductor layer 121).

As shown in FIG. 10, the channel 112 may be formed to connect one side and the other side of the growth substrate 110.

Furthermore, as shown in FIG. 10(b), the channel 112 may be extended from one side of the growth substrate 110 to a layer coming into contact with one side of the growth substrate 110 so that an ohmic contact characteristic between the growth substrate 110 and the layer coming into contact with one side of the growth substrate 110 is improved.

Accordingly, a potential barrier between the growth substrate 110 and the layer coming into contact with one side of the growth substrate 110 can be lowered, and field emission can be increased. Accordingly, a contact characteristic can be improved.

By way of example, as shown in FIGS. 10, 11(a), and 11(c), the layer coming into contact with one side of the growth substrate 110 may be a first semiconductor layer 121. However, the subject application is not limited to the example. For example, as shown in FIGS. 11(b) and 11(d), the layer coming into contact with one side of the growth substrate 110 may be a current dispersion layer 170.

Furthermore, referring to FIG. 10(b), since the channel 112 is extended, the conductive paths 111 may be extended from one side of the growth substrate 110 to the inside of the layer coming into contact with one side of the growth substrate 110.

The channel 112 may be formed by an ion implantation method.

In general, the ion implantation method is a method used to add impurities (dopant) to the semiconductor device, and is evident to those skilled in the art and thus a detailed description thereof is omitted. The channel 112 may be formed by implanting ions into the growth substrate 110 by the ion implantation method.

In accordance with the ion implantation method, the depth at which ions are implanted may be controlled. That is, referring to FIG. 10, the channel 112 may be extended up to the inside of the layer coming into contact with one side of the growth substrate 110 by implanting ions into the layer coming into contact with one side of the growth substrate 110 through control of the depth at which ions are implanted (a depth in up and down directions).

Meanwhile, the light-emitting unit 120 may include one or more of an n-doping portion and a p-doping portion.

By way of example, the semiconductor layer 121 and the second semiconductor layer 124 may be doped with an n type and a p type, and vice versa. Accordingly, the light-emitting unit 120 may include one or more of the n-doping portion and the p-doping portion. By way of example, the semiconductor layer 121 may be doped with p-GaN, and the second semiconductor layer 124 may be doped with n-GaN.

If the growth substrate 110 comes into contact with the n-doping portion, the channel 112 may be formed by the implantation of n type ions. If the growth substrate 110 comes into contact with the p type doping unit, the channel 112 may be formed by the implantation of p type ions.

In other words, the channel 112 may be formed by implanting ions advantageous for an ohmic contact between the growth substrate 110 and the light-emitting unit 120 depending on the p/n type of the semiconductor layer 121. Accordingly, an ohmic contact characteristic can be maximized.

By way of example, if the semiconductor layer 121 is doped with a p type, for example, if the semiconductor layer 121 is p-type GaN, the channel 112 may be formed because magnesium ions are implanted into the growth substrate 110 by an ion implantation method. Accordingly, the ohmic contact characteristic of the growth substrate 110 and the semiconductor layer 121 can be extremely maximized.

Figure 11:
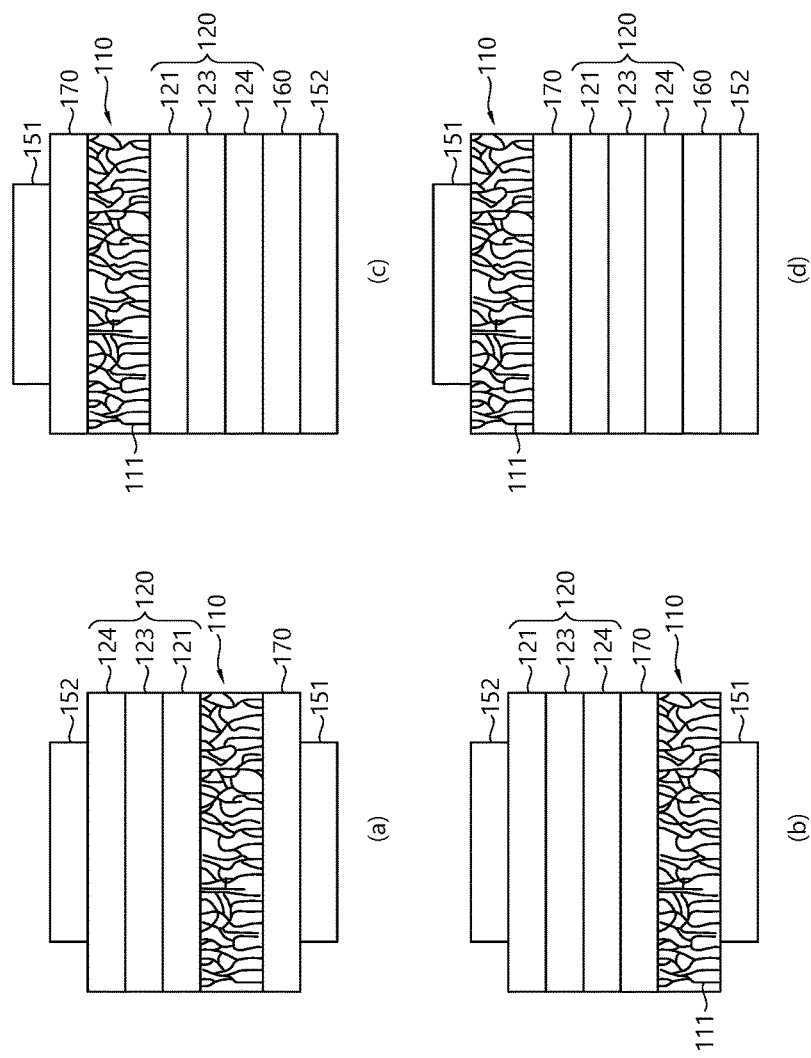
FIGS. 11(a) and 11(b) are schematic cross-sectional views of a light-emitting device including a current dispersion layer according to an embodiment of the subject application.
FIGS. 11(c) and 11(d) are schematic cross-sectional views of a light-emitting device including a current dispersion layer and a reflector according to an embodiment of the subject application.

Furthermore, referring to FIG. 11, the subject light-emitting device may include the current dispersion layer 170 formed to come into contact with one or more of one side and the other side of the growth substrate 110.

The current dispersion layer 170 can spread a current. By way of example, the current dispersion layer 170 may interconnect the conductive paths 111.

More specifically, as shown in FIGS. 11(b) and 11(d), the current dispersion layer 170 may be formed between the growth substrate 110 and the light-emitting unit 120. In this case, a current that is introduced from the electrode pad 151 and introduced into the current dispersion layer 170 through the growth substrate 110 may be spread and injected into the entire region of the light-emitting unit 120.

Furthermore, as shown in FIGS. 11(a) and 11(c), the current dispersion layer 170 may be formed between the growth substrate 110 and the electrode pad 151. In this case, a current introduced from the electrode pad 151 may be spread into the entire region of the growth substrate 110 by the current dispersion layer 170 and then injected into the growth substrate 110.

That is, the current dispersion layer 170 can improve a current spreading characteristic. In accordance with such a current dispersion layer 170, the size of the electrode pad 151 and the second electrode pad 152 can be minimized.

The current dispersion layer 170 may include one or more of a CNT layer and a graphene layer.

CNT or graphene has excellent conductivity and light transmittance characteristics. In the present invention, the conductive paths 111 of the growth substrate 110 may be interconnected by forming the current dispersion layer 170 in one or more of one side and the other side of the growth substrate 110 using such characteristics.

In this case, as the thickness of the current dispersion layer 170 increases, CNTs or graphenes within the current dispersion layer 170 are interconnected. Accordingly, the conductivity of the growth substrate 110 is improved because the probability that the conductive paths 111 may be interconnected increases, but transmittance may be reduced. Accordingly, it is preferred that the current dispersion layer 170 of the present invention is formed as thin as possible within the limits to which the conductive paths 111 of the growth substrate 110 are sufficiently interconnected, but transmittance is not reduced.

By way of example, the current dispersion layer 170 may be formed in a thickness of about 2 nm to about 100 nm. For reference, 2 nm is a minimum thickness at which CNTs or graphenes can be formed into a single layer, and 100 nm is a maximum thickness at which transmittance of light can be maintained 80% more.

Furthermore, referring to FIG. 12, the subject light-emitting device may include the buffer layer 180. As shown in FIG. 12, the buffer layer 180 may be formed between the growth substrate 110 and the light-emitting unit 120. By way of example, the buffer layer 180 may include undoped GaN.

The aforementioned light-emitting device may be applied to common type, flip-chip type, and vertical type light-emitting devices. That is, in accordance with the subject light-emitting device, in the common type, flip-chip type, and vertical type light-emitting devices, a current may be vertically injected into the light-emitting unit 120 using the conductive paths 111 within the growth substrate 110 formed through EBD.

A method for manufacturing a light-emitting device according to an embodiment of the subject application (hereinafter referred to as "the subject method for manufacturing a light-emitting device") is described below. However, the same reference numerals are used in elements that are similar to or identical with the aforementioned elements, and a redundant description is simply given or omitted.

Figure 13:
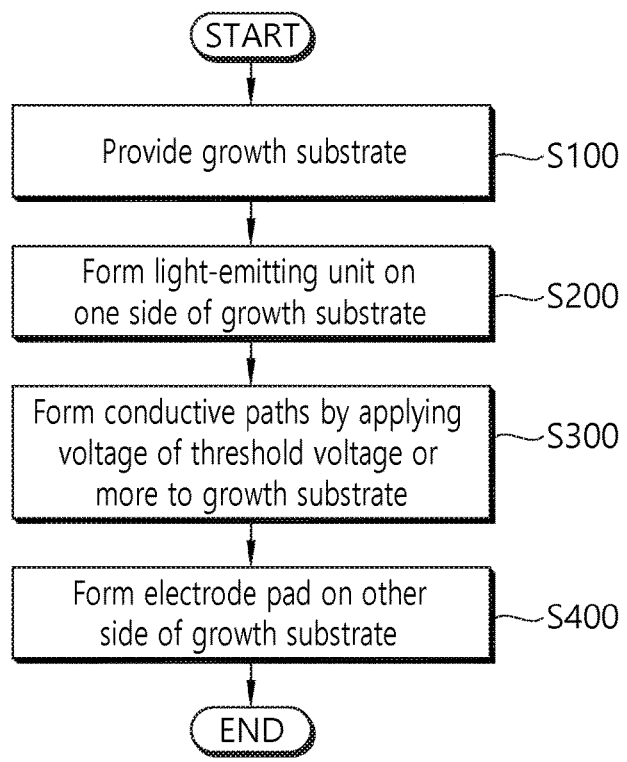
FIG. 13 is a schematic block diagram for illustrating a method for manufacturing a light-emitting device according to an embodiment of the subject application.
Figure 14:
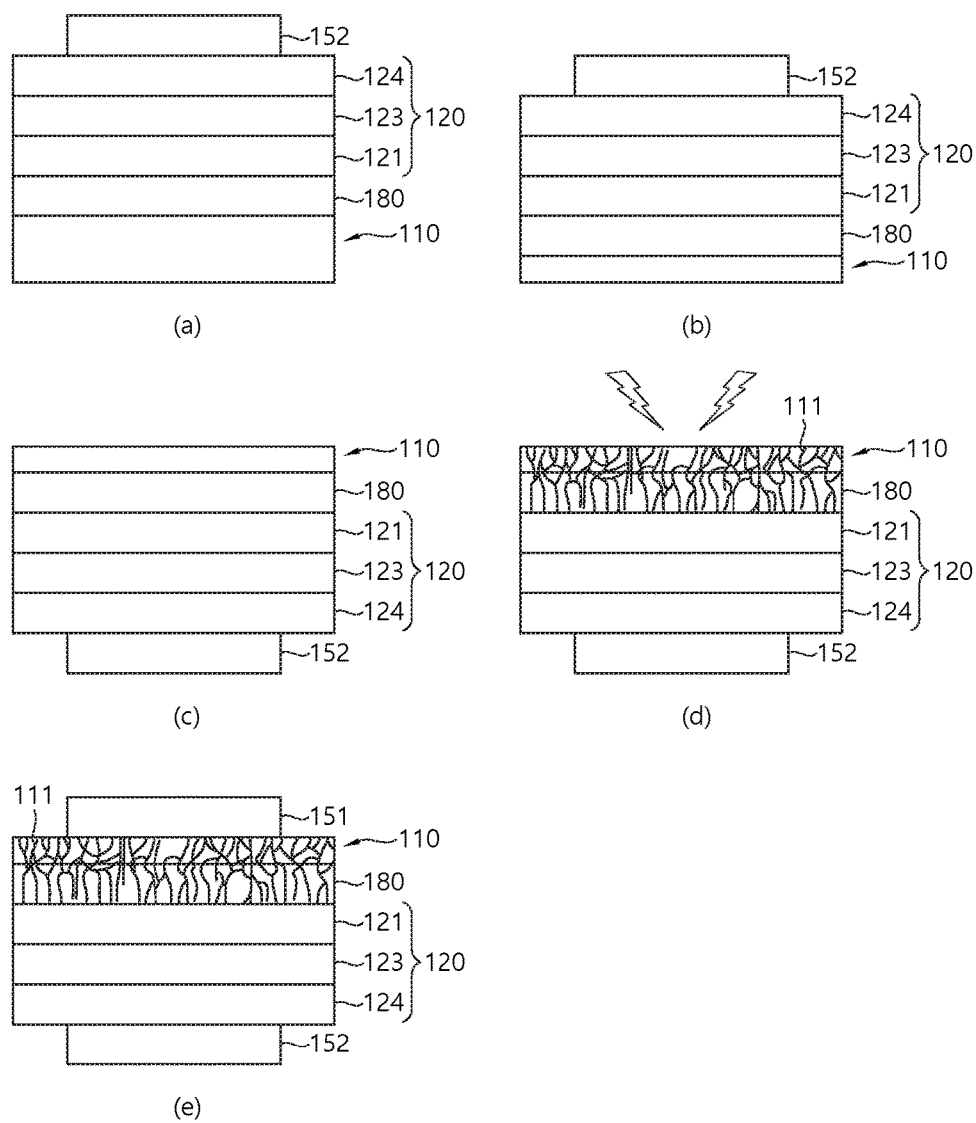
FIG. 14 is a conceptual diagram for illustrating a method for manufacturing a common type light-emitting device according to a method for manufacturing a light-emitting device according to an embodiment of the subject application.
Figure 15:
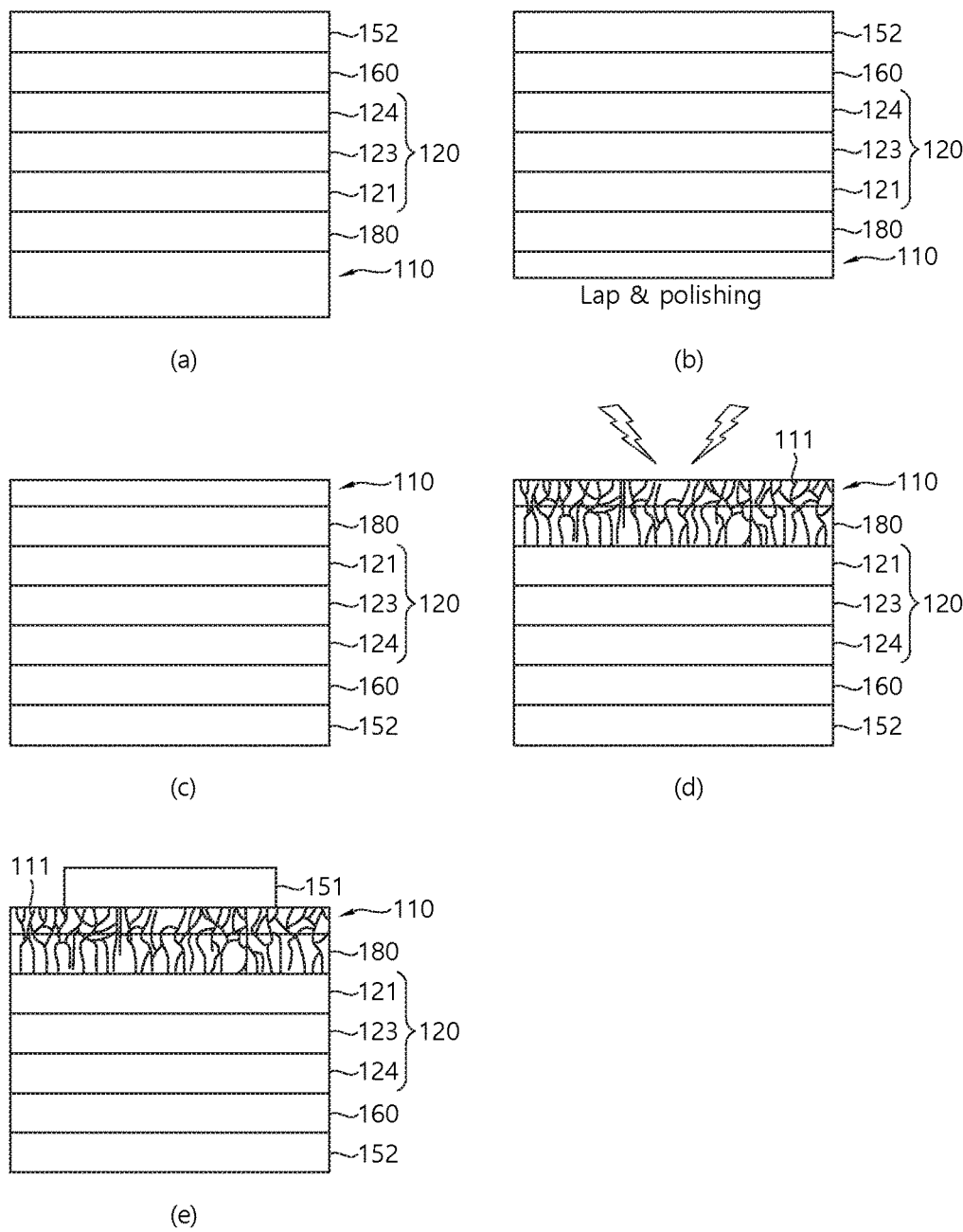
FIG. 15 is a conceptual diagram for illustrating a method for manufacturing a vertical type light-emitting device according to a method for manufacturing a light-emitting device according to an embodiment of the subject application.

FIG. 13 is a schematic block diagram for illustrating a method for manufacturing a light-emitting device according to an embodiment of the subject application, FIG. 14 is a conceptual diagram for illustrating a method for manufacturing a common type light-emitting device according to a method for manufacturing a light-emitting device according to an embodiment of the subject application, and FIG. 15 is a conceptual diagram for illustrating a method for manufacturing a vertical type light-emitting device according to a method for manufacturing a light-emitting device according to an embodiment of the subject application.

Referring to FIG. 13, the subject method for manufacturing a light-emitting device includes step S100 of providing the growth substrate 110, step S200 of forming the light-emitting unit 120 on one side of the growth substrate 110, step S300 of forming the conductive paths 111 by applying a voltage of a threshold voltage or more to the growth substrate 110, and step S400 of forming the electrode pad 151 on the other side of the growth substrate 110.

Elements related to the subject method for manufacturing a light-emitting device are described in detail below.

At step S200 of forming the light-emitting unit 120 on one side of the growth substrate 110, referring to FIGS. 14(a) and 15(a), the first semiconductor layer 121, the active layer 123, and the second semiconductor layer 124 may be formed on one side of the growth substrate 110.

Furthermore, referring to FIGS. 14(a) and 15(a), prior to step S200 of forming the light-emitting unit 120, the buffer layer 180 may be formed on one side of the growth substrate 110. Furthermore, referring to FIG. 15(a), at step S200 of forming the light-emitting unit 120, a reflector 160 may be formed on the light-emitting unit 120.

Furthermore, referring to FIGS. 14(a) and 15(a), at step S200 of forming the light-emitting unit 120, the second electrode pad 152 may be formed. By way of example, as shown in FIG. 14(a), the second electrode pad 152 may be formed on one side of the second semiconductor layer 124. Alternatively, as shown in FIG. 15(a), the second electrode pad 152 may be formed on one side of the reflector 160.

Furthermore, referring to FIGS. 14(b) and 15(b), the subject method for manufacturing a light-emitting device may include a step of removing the growth substrate 110 from the other side of the growth substrate 110 by a specific thickness prior to step S300 of forming the conductive paths 111.

After the light-emitting unit 120 is formed, when the conductive paths 111 are formed, the thinner the growth substrate 110, the better conductivity. However, it is preferred that the specific thickness is set within a range in which a layer formed on one side of the growth substrate 110 is not damaged in the process of removing part of the growth substrate 110.

By way of example, the step of forming the growth substrate 110 by the specific thickness may be performed by grinding the growth substrate 110 by lapping & polishing. Alternatively, the step of forming the growth substrate 110 by the specific thickness may be performed by grinding the growth substrate 110 by CMP. Alternatively, the growth substrate 110 may be removed by the specific thickness through lift-off or etching.

Furthermore, referring to FIGS. 14(c) and 15(c), the subject method for manufacturing a light-emitting device may include a step of turning over the growth substrate 110 in which the light-emitting unit 120 has been formed. The step of turning over the growth substrate 110 means that the other side of the growth substrate 110 directed toward the lower side is directed toward the upper side.

Furthermore, the subject method for manufacturing a light-emitting device may include a step of forming an electrode for forming (not shown) on the other side of the growth substrate 110 prior to step S300 of forming the conductive paths 111.

The step of forming the electrode for forming may include steps of stacking a photoresist on the other side of the growth substrate 110, forming an electrode pattern on the photoresist, depositing metal on the electrode pattern, and removing the photoresist.

More specifically, a photoresist layer may be formed on the other side of the growth substrate 110, and the electrode pattern for forming may be formed on the photoresist layer by exposing and developing the location where the electrode for forming will be formed using a mask. In this case, the electrode pattern may be formed to include at least two electrodes in order to apply a voltage. Next, the inside of the pattern may be filled by depositing metal on the photoresist layer on which the pattern has been formed and the photoresist layer may be removed by performing a lift-off process, thereby being capable of forming the electrode for forming for forming the conductive paths 111. However, such a process is an embodiment, and the electrode for forming may be formed through various processes.

Furthermore, referring to FIGS. 14(d) and 15(d), at step S300 of forming the conductive paths 111, a voltage of a threshold voltage or more may be applied through the electrode for forming.

When the voltage of the threshold voltage or more is applied, the conductive paths 111 may be formed.

Furthermore, although not shown in FIGS. 14 and 15, the subject method for manufacturing a light-emitting device may include a step of forming the channel 112 on which electrons can hop in the growth substrate 110, between step S200 of forming the light-emitting unit 120 and step S300 of forming the conductive paths 111.

By way of example, it is preferred that step S300 of forming the conductive paths 111 after the step of forming the channel 112.

At the step of forming the channel 112, the channel 112 may be formed to connect one side and the other side of the growth substrate 110.

Furthermore, at the step of forming the channel 112, the channel 112 may be extended from one side of the growth substrate 110 to the inside of a layer coming into contact with one side of the growth substrate 110 so that the ohmic contact characteristic of the growth substrate 110 and the layer coming into contact with one side of the growth substrate 110 is improved.

By way of example, the layer coming into contact with one side of the growth substrate 110 may be the light-emitting unit 120.

However, the subject application is not limited to the example. By way of example, prior to step S200 of forming the light-emitting unit 120, if the buffer layer 180 has been formed on one side of the growth substrate 110, the layer coming into contact with one side of the growth substrate 110 may be the buffer layer 180, as shown in FIGS. 14 and 15.

Furthermore, at the step of forming the channel 112, the channel 112 may be formed by an ion implantation method.

Furthermore, the subject method for manufacturing a light-emitting device may include a step of removing the electrode for forming after step S300 of forming the conductive paths 111.

By way of example, the step of forming the electrode for forming may be performed between step S300 (refer to FIGS. 14(d) and 15(d)) of forming the conductive paths 111 and step S400 (refer to FIGS. 14(e) and 15(e)) of forming the electrode pad 151.

Furthermore, the subject method for manufacturing a light-emitting device may include a step of forming the current dispersion layer 170 on the other side of the growth substrate 110 between step S300 of forming the conductive paths 111 and step S400 of forming the electrode pad 151.

Furthermore, the subject method for manufacturing a light-emitting device may include a step of forming the current dispersion layer 170 on one side of the growth substrate 110 prior to step S200 of forming the light-emitting unit 120.

Furthermore, at the step of providing the growth substrate 110, the growth substrate 110 may include a plurality of insulator layers stacked in a multi-layer.

If the growth substrate 110 has the plurality of insulator layers stacked in a multi-layer as described above, at step S300 of forming the conductive paths 111, the conductive paths 111 may be formed by considering the growth substrate 110, that is, the multi-layer, to be a single insulator.

The aforementioned description of the subject application is illustrative, and those skilled in the art to which the subject application pertains will appreciate that the subject application may be implemented in other detailed forms without departing from the technical spirit or essential characteristics of the subject application. Accordingly, the aforementioned embodiments should be construed as being only illustrative not as being restrictive from all aspects. For example, each of the elements described in the singular forms may be distributed and implemented. Likewise, elements described in a distributed way may also be combined and implemented.

The scope of the present invention is defined by the appended claims rather than the detailed description, and the present invention should be construed as covering all modifications or variations derived from the meaning and scope of the appended claims and their equivalents.

The invention claimed is:

1. A semiconductor device, comprising:
a semiconductor layer; and
a transparent electrode made of a resistance change substance and formed on one side of the semiconductor layer,
wherein the transparent electrode comprises a channel on which electrons are capable of hopping and conductive paths formed by applying a voltage of a threshold voltage or more, and
the threshold voltage forming the conductive paths is lowered by the channel.

2. The semiconductor device of claim 1, wherein the channel is formed to connect one side and an other side of the transparent electrode.

3. The semiconductor device of claim 1, wherein the channel is extended from an other side of the transparent electrode to an inside of a layer contacting with the other side of the transparent electrode.

4. The semiconductor device of claim 1, further comprising a metal electrode pad formed on one side of the transparent electrode.

5. The semiconductor device of claim 1, further comprising a current spreading layer formed between the transparent electrode and the semiconductor layer,
wherein the current spreading layer comprises a CNT layer or a graphene layer.

6. A method for manufacturing a semiconductor device, comprising steps of:
providing a semiconductor layer;
forming a transparent electrode made of a resistance change substance on one side of the semiconductor layer;
forming a channel on which electrons are capable of hopping in the transparent electrode; and
forming conductive paths by applying a voltage of a threshold voltage or more to the transparent electrode in which the channel is formed,
wherein the channel lowers the threshold voltage forming the conductive paths.

7. The method of claim 6, wherein the step of forming the conductive paths comprises steps of:
forming a metal electrode for forming on an other side of the transparent electrode; and
applying the voltage of the threshold voltage or more through the metal electrode for forming.

8. The method of claim 7, further comprising steps of:
removing the metal electrode for forming after the step of forming the conductive paths;
forming a current spreading layer on the other side of the transparent electrode; and
forming a metal electrode pad on the current spreading layer,
wherein the current spreading layer comprises a CNT layer or a graphene layer.

9. The method of claim 6, wherein in the step of forming the channel, the channel is formed to connect one side and an other side of the transparent electrode.

10. A light-emitting device, comprising:
a growth substrate;
a light-emitting unit formed on one side of the growth substrate; and
an electrode pad formed on an other side of the growth substrate,
wherein the growth substrate comprises conductive paths formed by applying a voltage of a threshold voltage or more so that the electrode pad and the light-emitting unit are electrically connected.

11. The light-emitting device of claim 10, wherein the voltage of the threshold voltage or more is applied through a metal electrode for forming which is formed on the other side of the growth substrate.

12. The light-emitting device of claim 10, wherein the growth substrate has a plurality of insulator layers stacked in a multi-layer.

13. The light-emitting device of claim 12, wherein an insulator layer which belongs to the plurality of insulator layers and is located on an outermost side corresponding to the one side or the other side of the growth substrate has a greater defect than an insulator layer located on an inside.

14. The light-emitting device of claim 10, further comprising a current dispersion layer formed to come into contact with one or more of the one side and the other side of the growth substrate,
wherein the current dispersion layer comprises one or more of a CNT layer and a graphene layer.

15. The light-emitting device of claim 10, wherein the light-emitting unit comprises a first semiconductor layer, an active layer, and a second semiconductor layer.

16. A method for manufacturing a light-emitting device, comprising steps of:
providing a growth substrate;
forming a light-emitting unit on one side of the growth substrate;
forming conductive paths by applying a voltage of a threshold voltage or more to the growth substrate; and
forming an electrode pad on an other side of the growth substrate.

17. The method of claim 16, further comprising an electrode for forming on the other side of the growth substrate prior to the step of forming the conductive paths,
wherein the step of forming the conductive paths comprises applying the voltage of the threshold voltage or more through the electrode for forming.

18. The method of claim 16, wherein in the step of forming the conductive paths, the conductive paths are extended from the growth substrate to a layer formed on the one side or the other side of the growth substrate.

19. The method of claim 16, further comprising a step of removing the growth substrate by a specific thickness from the other side of the growth substrate prior to the step of forming the conductive paths.

20. The method of claim 16, wherein in the step of providing the growth substrate, the growth substrate has a plurality of insulator layers stacked in a multi-layer.

* * * * *